(12) United States Patent
Chung et al.

(10) Patent No.: US 11,485,904 B2
(45) Date of Patent: Nov. 1, 2022

(54) LAYERED STRUCTURES, PRODUCTION METHODS THEREOF, AND LIQUID CRYSTAL DISPLAY INCLUDING THE SAME

(71) Applicants: SAMSUNG ELECTRONICS CO., LTD., Suwon-si (KR); Samsung Display Co., Ltd., Yongin-si (KR); SAMSUNG SDI CO., LTD., Yongin-si (KR)

(72) Inventors: Deukseok Chung, Yongin-si (KR); Tae Won Jeong, Yongin-si (KR); Tae Gon Kim, Hwaseong-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 62 days.

(21) Appl. No.: 15/900,496

(22) Filed: Feb. 20, 2018

(65) Prior Publication Data
US 2018/0237690 A1     Aug. 23, 2018

(30) Foreign Application Priority Data
Feb. 20, 2017   (KR) .................. 10-2017-0022575

(51) Int. Cl.
*C09K 11/02* (2006.01)
*C08F 220/06* (2006.01)
(Continued)

(52) U.S. Cl.
CPC ........ *C09K 11/025* (2013.01); *C08F 22/1006* (2020.02); *C08F 220/06* (2013.01);
(Continued)

(58) Field of Classification Search
CPC .. C09K 11/025; C09K 11/703; C09D 133/02; C09D 4/00; G03F 7/0047; G03F 7/0007;
(Continued)

(56) References Cited

U.S. PATENT DOCUMENTS 4,975,347 A * 12/1990 Ahne .................. G03F 7/032
                                                430/18
7,659,661 B2    2/2010 Park
(Continued)

FOREIGN PATENT DOCUMENTS

JP    2016141051 A    8/2016
KR  1020060055054 A   5/2006
(Continued)

OTHER PUBLICATIONS

English Translation of Office Action dated Jun. 7, 2022 of the corresponding Korean Patent Application No. 10-2018-0020079, 8 pp.

(Continued)

*Primary Examiner* — Anthony J Frost
(74) *Attorney, Agent, or Firm* — Cantor Colburn LLP

(57) ABSTRACT

A layered structure including a luminescent layer including a quantum dot polymer composite pattern; an inorganic layer disposed on the luminescent layer, the inorganic layer including a metal oxide, a metal nitride, a metal oxynitride, a metal sulfide, or a combination thereof; and an organic layer being disposed between the luminescent layer and the inorganic layer, the organic layer including an organic polymer, a method of producing the same, and a liquid crystal display including the same. The quantum dot polymer composite pattern includes a repeating section including a polymer matrix; and a plurality of quantum dots (e.g., dispersed) in the polymer matrix, the repeating unit including a first section configured to emit light of a first light, and wherein the inorganic layer is disposed on at least a portion of a surface of the repeating section.

18 Claims, 10 Drawing Sheets

(51) Int. Cl.

| | | |
|---|---|---|
| *C08G 77/04* | (2006.01) | |
| *C08K 3/32* | (2006.01) | |
| *C08K 3/30* | (2006.01) | |
| *C08K 9/10* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *G03F 7/004* | (2006.01) | |
| *G03F 7/033* | (2006.01) | |
| *G02F 1/13357* | (2006.01) | |
| *G02F 1/1335* | (2006.01) | |
| *C09K 11/70* | (2006.01) | |
| *G03F 7/00* | (2006.01) | |
| *C09D 4/00* | (2006.01) | |
| *C09D 133/02* | (2006.01) | |
| *C08F 22/10* | (2006.01) | |
| *B82Y 40/00* | (2011.01) | |
| *B82Y 20/00* | (2011.01) | |
| *C08K 5/00* | (2006.01) | |
| *C08G 77/20* | (2006.01) | |

(52) U.S. Cl.
CPC ............... *C08G 77/04* (2013.01); *C08K 3/30* (2013.01); *C08K 3/32* (2013.01); *C08K 9/10* (2013.01); *C09D 4/00* (2013.01); *C09D 133/02* (2013.01); *C09K 11/703* (2013.01); *G02F 1/133516* (2013.01); *G02F 1/133617* (2013.01); *G03F 7/0007* (2013.01); *G03F 7/0043* (2013.01); *G03F 7/0047* (2013.01); *G03F 7/033* (2013.01); *G03F 7/162* (2013.01); *G03F 7/168* (2013.01); *G03F 7/2002* (2013.01); *G03F 7/322* (2013.01); *G03F 7/40* (2013.01); *B82Y 20/00* (2013.01); *B82Y 40/00* (2013.01); *C08F 2800/10* (2013.01); *C08G 77/20* (2013.01); *C08K 5/0091* (2013.01); *C08K 2003/3036* (2013.01); *C08K 2201/001* (2013.01); *C08K 2201/011* (2013.01); *G02F 2201/50* (2013.01); *Y10S 977/774* (2013.01); *Y10S 977/818* (2013.01); *Y10S 977/824* (2013.01); *Y10S 977/892* (2013.01); *Y10S 977/896* (2013.01); *Y10S 977/95* (2013.01)

(58) Field of Classification Search
CPC .......... G03F 7/033; G03F 7/0043; G03F 7/40; G03F 7/322; G03F 7/2002; G03F 7/168; G03F 7/162; G02F 1/133516; G02F 1/133617; G02F 2201/50; C08K 9/10; C08K 3/30; C08K 3/32; C08K 5/0091; C08K 2201/001; C08K 2201/011; C08K 2003/3036; C08F 22/105; C08F 220/06; C08F 2800/10; C08G 77/04; C08G 77/20; Y10S 977/892; Y10S 977/896; Y10S 977/824; Y10S 977/818; Y10S 977/774; Y10S 977/95; B82Y 20/00; B82Y 40/00
See application file for complete search history.

(56) References Cited

U.S. PATENT DOCUMENTS

| | | |
|---|---|---|
| 8,557,325 B2 | 10/2013 | Park |
| 9,753,324 B2 | 9/2017 | Jang et al. |
| 10,427,392 B2 | 10/2019 | Iwase |
| 10,852,584 B2 | 12/2020 | Cho et al. |
| 11,126,028 B2 | 9/2021 | Jang et al. |
| 2005/0202265 A1* | 9/2005 | Naruse ............... H01L 51/5256 428/323 |
| 2009/0140220 A1* | 6/2009 | Lee .......................... C08F 2/50 252/586 |
| 2010/0019664 A1* | 1/2010 | Mishima ............. H01L 51/5268 313/504 |
| 2011/0242796 A1* | 10/2011 | Yang ...................... C09J 11/02 362/97.1 |
| 2012/0156436 A1* | 6/2012 | Kim ..................... C09K 11/565 428/172 |
| 2014/0004641 A1* | 1/2014 | Sonoda .................... H01L 51/56 438/34 |
| 2014/0147654 A1* | 5/2014 | Walther .............. C23C 18/1245 428/312.6 |
| 2014/0160408 A1* | 6/2014 | Cho .................. G02F 1/133617 349/110 |
| 2014/0192294 A1* | 7/2014 | Chen ....................... F21V 9/08 349/69 |
| 2015/0252125 A1 | 9/2015 | Moro et al. |
| 2015/0330603 A1* | 11/2015 | Oba .................. G02F 1/133617 349/71 |
| 2016/0223869 A1 | 8/2016 | Sim et al. |

FOREIGN PATENT DOCUMENTS

| | | |
|---|---|---|
| KR | 101184434 B1 | 9/2012 |
| KR | 1020150080135 A | 7/2015 |
| KR | 1020150105897 A | 9/2015 |
| KR | 1020160028858 A | 3/2016 |
| KR | 1020160093783 A | 8/2016 |
| KR | 1020160123838 A | 10/2016 |

OTHER PUBLICATIONS

Office Action dated Jun. 7, 2022 of the corresponding Korean Patent Application No. 10-2018-0020079, 6 pp.

* cited by examiner

Pattern Preparation by using a photoresist

Repeating the Patterning Process three times

LAYERED STRUCTURES, PRODUCTION METHODS THEREOF, AND LIQUID CRYSTAL DISPLAY INCLUDING THE SAME

CROSS-REFERENCE TO RELATED APPLICATION

This application claims a priority to Korean Patent Application No. 10-2017-0022575, filed on Feb. 20, 2017, and all the benefits accruing therefrom under 35 U.S.C. § 119, the content of which in its entirety is herein incorporated by reference.

BACKGROUND

1. Field

Layered structures, production methods thereof, and liquid crystal displays including the same are disclosed.

2. Description of the Related Art

A liquid crystal display ("LCD") is a flat panel display device that may include a liquid crystal panel including two substrates (e.g., a lower substrate and an upper substrate) on which a pixel electrode and a common electrode are formed, and a liquid crystal layer disposed therebetween. The lower (array) substrate may have a plurality of gate wires and data wires defining a pixel area, and may include a thin film transistor at a crossing point, e.g., intersection, of two wires that may be connected with a pixel electrode of each pixel area. The upper substrate may include a color filter layer that includes patterned (red, green, and blue) absorption-type color filter sections corresponding to the pixel area. The liquid crystal display may include an optical element (e.g., polarizer) on, under and/or inside a liquid crystal panel.

SUMMARY

An embodiment provides a layered structure from which a liquid crystal display having improved luminous efficiency may be prepared.

An embodiment provides a method of producing the layered structure.

An embodiment provides a liquid crystal display including the layered structure.

In an embodiment, a layered structure includes
a luminescent layer including a quantum dot polymer composite pattern;
an inorganic layer being disposed on the luminescent layer, the inorganic layer including an inorganic material including a metal oxide, a metal nitride, a metal oxynitride, a metal sulfide, or a combination thereof; and
an organic layer being disposed between the luminescent layer and the inorganic layer, the organic layer including an organic polymer (e.g., an electrically insulating organic polymer);
wherein the quantum dot polymer composite pattern includes a repeating section including a polymer matrix and a plurality of quantum dots (e.g., dispersed) in the polymer matrix, the repeating unit including a first section configured to emit light of a first light, and
wherein the inorganic layer is disposed on at least a portion of a surface of the repeating section.

The layered structure further includes a substrate (e.g., a transparent and electrically insulative substrate) disposed on a surface of the luminescent layer opposite to the inorganic layer.

The polymer matrix may include a cross-linked polymer and a linear polymer including a carboxylic acid group-containing repeating unit.

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof.

The carboxylic acid group-containing repeating unit of the linear polymer may include a unit derived from a monomer including a carboxylic acid group and a carbon-carbon double bond, a unit derived from a monomer including a dianhydride moiety, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

In some embodiments, the quantum dot does not include cadmium.

The quantum dot may include a core-shell structure.

The quantum dot may include an organic ligand on a surface of the quantum dot.

The organic ligand may include RCOOH, $RNH_2$, $R_2NH$, $R_3N$, RSH, $R_3PO$, $R_3P$, ROH, RCOOR', $RPO(OH)_2$, $R_2POOH$, wherein, R and R' are each independently a C5 to C24 substituted or unsubstituted aliphatic hydrocarbon group or a C6 to C20 substituted or unsubstituted aromatic hydrocarbon group, polymer organic ligand, or a combination thereof.

The repeating section may further include a second section configured to emit a second light that is different from the first light, a third section configured to emit a third light that is different from the first light and the second light, or a combination thereof.

A maximum photoluminescent peak wavelength of the first light may be greater than about 580 nanometers (nm) and less than or equal to about 680 nm.

A maximum photoluminescent peak wavelength of the second light may be greater than about 480 nm and less than or equal to about 580 nm.

A maximum photoluminescent peak wavelength of the third light may be greater than about 380 nm and less than or equal to about 480 nm.

The organic layer may be disposed directly on the surface of the repeating section of the quantum dot polymer composite pattern. The inorganic layer may be disposed directly on the organic layer.

A material included in the inorganic layer may have a refractive index of about 1.4 to about 3.

The inorganic material may include a silicon oxide, a silicon nitride, a silicon oxynitride, a hafnium oxide, a tantalum oxide, a titanium oxide, a zirconium oxide, a zinc oxide, a zinc sulfide, a magnesium oxide, a cesium oxide, a lanthanum oxide, an indium oxide, a niobium oxide, an aluminum oxide, or a combination thereof.

The inorganic layer may include a continuous (deposition) film of the inorganic material.

The inorganic layer may include at least two layers of the inorganic material, wherein at least two adjacent layers optionally include a different composition of an inorganic material, a different thickness, a different refractive index, a different transmittance, or a combination thereof.

The inorganic layer may include a first layer including a first inorganic material and having a first refractive index and a second layer including a second inorganic material and having a second refractive index, wherein the second layer is directly adjacent (or contacts) the first layer and a difference between the second refractive index and the first refractive index is at least about 0.5 (e.g., the second refractive index is at least about 0.5 less than the first refractive index).

The first inorganic material and the second inorganic material may include the metal oxide, the metal nitride, the metal oxynitride, the metal sulfide, or a combination thereof.

The inorganic layer may include the first layer and the second layer disposed alternately.

A thickness of the first layer may be from about 3 nanometers to about 1,000 nanometers and a thickness of the second layer may be from about 3 nanometers to about 1,000 nanometers.

The thickness of the first layer may be greater than the thickness of the second layer.

The thickness of the first layer may be smaller than the thickness of the second layer.

The first inorganic material may have a lower refractive index than the second inorganic material and the first inorganic material may include a silicon oxide.

The second inorganic material may include a hafnium oxide, a tantalum oxide, a titanium oxide, a zirconium oxide, a magnesium oxide, a cesium oxide, a lanthanum oxide, an indium oxide, a niobium oxide, an aluminum oxide, a silicon nitride, or a combination thereof.

A thickness of the inorganic layer may be greater than or equal to about 100 nanometers and less than or equal to about 10 micrometers (μm).

The inorganic layer may have a transmittance of greater than or equal to about 90% for light having a wavelength of about 380 nanometers to about 520 nanometers.

The inorganic layer may have a surface roughness of less than or equal to about 100 nm.

The organic polymer of the organic layer may include an aliphatic hydrocarbon backbone, an aliphatic hydrocarbon backbone including a carbonyl group, an ester group, an ether group, a thioether group, an arylene group, an alicyclic hydrocarbon group, or a combination thereof interposed therein, a siloxane backbone including an organic side chain attached to a silicon atom, or a combination thereof.

The organic polymer of the organic layer may include a crosslinked organic polymer.

The organic polymer of the organic layer may include a unit represented by Chemical Formula 1:

Chemical Formula 1

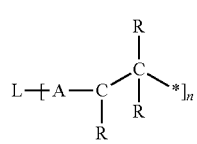

wherein L is a substituted or unsubstituted aliphatic hydrocarbon, a substituted or unsubstituted aliphatic hydrocarbon wherein at least one methylene group is replaced with an ester group, an ether group, a carbonyl group, an amide group, or a combination thereof, a substituted or unsubstituted alkylene oxide moiety, a substituted or unsubstituted polyalkylene oxide moiety, a substituted or unsubstituted heterocyclic moiety, a substituted or unsubstituted alicylic moiety, a substituted or unsubstituted aromatic hydrocarbon group, an organic siloxane moiety, or a combination thereof, R is the same or different and each is independently hydrogen or a C1 to C10 alkyl group, A is a single bond, a C1 to C10 alkylene group, an ether group, a carbonyl group, an ester group, —NH—, an amide group, or a combination thereof,

* is a portion that is linked to an adjacent unit in the polymer, and n is greater than or equal to 1 and less than or equal to 6.

The organic polymer may include a unit represented by Chemical Formula 1-1, a unit represented by Chemical Formula 1-2, or a combination thereof:

Chemical Formula 1-1

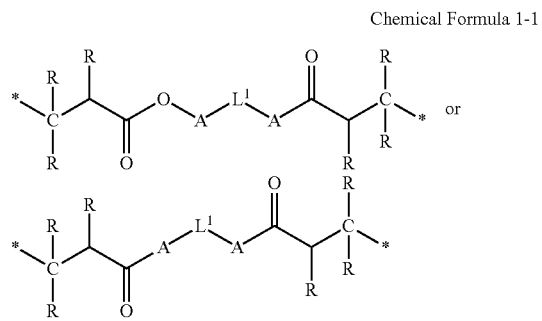

wherein $L^1$ is a C1 to C40 alkylene, a C1 to C40 alkenylene, —$(R^1O)n$- (where R is a C1 to C10 alkylene, and n is an integer from 1 to 20), —$(R^2O)n$-$(CR^3{}_2)$—$(R^4O)$m- (where $R^2$ and $R^4$ are the same or different and each independently a C1 to C10 alkylene, $R^3$ are the same or different and each is independently hydrogen or a C1 to C10 alkyl group, and n and m are the same or different and each independently an integer from 1 to 20), or a combination thereof, R is the same or different and each is independently hydrogen or a C1 to C10 alkyl group, A is the same or different and each is independently a single bond, —O—, —NH— or a combination thereof; and

* is a portion that is linked to an adjacent unit in the polymer,

Chemical Formula 1-2

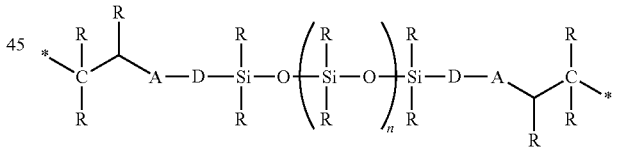

A is the same or different and each is independently a single bond, a C1 to C10 alkylene group, an ether group, a carbonyl group, an ester group, or a combination thereof, R is the same or different and each is independently hydrogen or a C1 to C10 alkyl group, D is the same or different and each is independently a single bond, a C1 to C10 alkylene group, a C1 to C10 alkylene group substituted with a hydroxyl group, or a combination thereof, wherein in the C1 to C10 alkylene group or the C1 to C10 alkylene group, a methylene may be replaced with an ether group, and

* is a portion that is linked to an adjacent unit in the polymer.

A thickness of the organic layer may be less than or equal to about 3 μm.

The organic layer may have a surface roughness of less than or equal to about 100 nm.

A cross-section of the layered structure may not show a defect of the organic layer at a position corresponding to a surface defect of the luminescent layer as observed by an electronic microscope.

The layered structure may further include an overcoat for planarization over the inorganic layer.

In an embodiment, a method of producing the layered structure includes:

applying a composition including a plurality of quantum dots, a photopolymerizable monomer including at least two polymerizable moieties, a linear polymer including a carboxylic acid group-containing repeating unit (e.g., a carboxylic acid linear polymer), a photoinitiator, and an organic solvent, on a substrate to form a film;

exposing a predetermined region of the formed film to light (e.g., having a wavelength of less than about 410 nm) to polymerize and cross-link in the exposed predetermined region and to form a quantum dot polymer composite dispersed in a polymer matrix;

removing an unexposed region from the film using an alkaline aqueous solution to obtain a quantum dot-polymer composite pattern;

heat-treating the quantum dot-polymer composite pattern to remove the organic solvent and form a heat-treated quantum dot-polymer composite pattern;

forming an organic layer including an organic polymer on the heat-treated quantum dot-polymer composite pattern; and forming an inorganic layer including the inorganic material on the organic layer.

The formation of the organic layer may include applying a liquid composition including a compound represented by Chemical Formula 2 on the heat-treated quantum dot-polymer composite pattern and conducting a polymerization reaction with the compound:

Chemical Formula 2

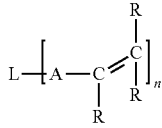

wherein L is a substituted or unsubstituted aliphatic hydrocarbon, a substituted or unsubstituted aliphatic hydrocarbon wherein at least one methylene group is replaced with an ester group, an ether group, a carbonyl group, an amide group, or a combination thereof, a substituted or unsubstituted alkylene oxide moiety, a substituted or unsubstituted polyalkylene oxide moiety, a substituted or unsubstituted heterocyclic moiety, a substituted or unsubstituted alicylic moiety, a substituted or unsubstituted aromatic hydrocarbon group, an organic siloxane moiety, or a combination thereof, A is a single bond, a C1 to C10 alkylene group, an ether group, a carbonyl group, an ester group, —NH—, an amide, or a combination thereof, R is the same or different and each is independently hydrogen or a C1 to C10 alkyl group, and n is an integer of greater than or equal to 1 and less than or equal to 6.

The compound represented by Chemical Formula 2 may include an oligomer having a weight average molecular weight of less than or equal to about 5,000 grams per mole (g/mol).

The liquid composition may have a shear viscosity of less than or equal to about 50 centipoise (cps) at a temperature of about 25° C.

The liquid composition may have a surface tension of less than or equal to about 50 dyne per centimeter (dyne/cm).

The forming of the inorganic layer may include physical vapor deposition, chemical vapor deposition, or a combination thereof.

The light may have a wavelength of less than about 410 nanometers.

In the method, the series of the processes may be repeated at least twice.

In an embodiment, a liquid crystal display includes:

a liquid crystal panel including a lower substrate, an upper substrate, a liquid crystal layer disposed between the upper and lower substrates, and a photoluminescent color filter layer provided on the upper substrate;

a polarizer disposed under the lower substrate; and a backlight unit disposed under the polarizer and emitting blue light, wherein the photoluminescent color filter layer includes the aforementioned layered structure.

The liquid crystal display may further include an optical element between the photoluminescent color filter layer and the liquid crystal layer.

The optical element may include a polarizer, a coating that controls a refractive index without a polarization function, or a combination thereof.

In the liquid crystal display, the repeating section may further include a second section configured to emit light of a second peak wavelength that is different from the first peak wavelength.

The liquid crystal display may further include a blue light blocking element (e.g., a blue cut filter) disposed (e.g., on a region corresponding to the first and/or second section(s)) on the repeating section.

In the embodiment, when the layered structure including the quantum dot polymer pattern is prepared using an alkaline developable photoresist and has undergone a heat treatment at a relatively high temperature of about 180° C. to about 230° C., luminous efficiency of the quantum dot (e.g., semiconductor nanocrystal particle) may be kept, e.g., retained, at an improved level.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
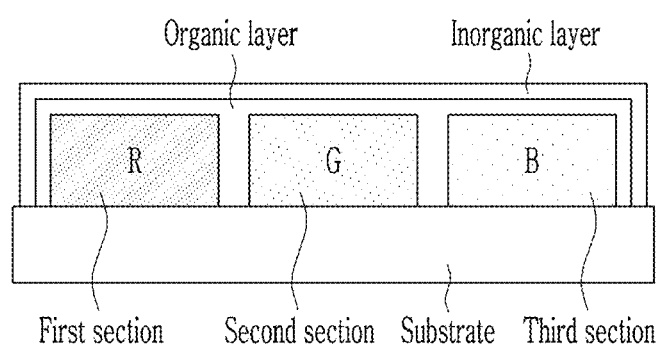
FIG. 1 is a schematic view showing an embodiment of a cross-section of a layered structure.

Advantages and characteristics of this disclosure, and a method for achieving the same, will become evident referring to the following example embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "hydrophobic moiety" refers to a moiety providing the corresponding compound with a tendency to be agglomerated in an aqueous solution and to repel water. For example, the hydrophobic moiety may include an aliphatic hydrocarbon group (alkyl, alkenyl, alkynyl, etc.) having at least one (two, three, four, five, or six or higher) carbon atoms, an aromatic hydrocarbon group (phenyl, naphthyl, aralkyl group, etc.) having at least six carbon atoms, or an alicyclic hydrocarbon group (cyclohexyl, norbornenyl, etc.) having at least five carbon atoms. The hydrophobic moiety is not mixed with the ambient medium since it is substantially lacking capability of making a hydrogen bond with the ambient medium, or since the polarity thereof is not matched with that of the ambient medium.

As used herein, the term "visible light" refers to light having a wavelength of about 390 nanometers (nm) to about 700 nm. As used herein, the term ultraviolet ("UV") may refer to light having a wavelength of greater than or equal to about 200 nm and less than about 390 nm.

As used herein, a (blue) photoconversion efficiency refers to a percentage of emission light relative to incident light (e.g., blue light). For example, a blue photoconversion efficiency is a percentage of a light emission dose of a quantum dot polymer composite relative to absorbed light dose of the quantum dot polymer composite from excitation light (i.e., blue light). The total light dose (B) of excitation light may be obtained by integrating its photoluminescence ("PL") spectrum, the PL spectrum of the quantum dot polymer composite film is measured, a dose (A) of light in a green or red wavelength region emitted from the quantum dot polymer composite film and a dose (B') of blue light may be obtained, and a photoconversion efficiency, a quantum efficiency, and a blue absorption rate may be obtained by the following equation:

$$A/(B-B')\times 100\% = \text{photoconversion efficiency (\%)}$$

A/B=quantum efficiency,
(B−B')/B=blue absorption rate.

As used herein, when a definition is not otherwise provided, the term "dispersion" refers to a dispersion, wherein a dispersed phase includes a solid and a continuous phase includes a liquid. For example, the term "dispersion" may refer to a colloidal dispersion wherein the dissolved or dispersed phase has a dimension of about 1 nm to about several micrometers (μm) (e.g., 1 μm or less, 2 μm or less, or 3 μm or less).

As used herein, "Group" refers to a Group of Periodic Table.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and Tl, but are not limited thereto.

"Group IV" refers to a Group IVA and a Group IVB, and examples of the Group IV metal may include Si, Ge, and Sn but are not limited thereto. As used herein, the term "a metal" may include a semi-metal such as Si.

"Group I" refers to a Group IA and a Group IB, and may include Li, Na, K, Rb, and Cs but are not limited thereto.

"Group V" refers to Group VA and may include nitrogen, phosphorus, arsenic, antimony, and bismuth but is not limited thereto.

"Group VI" refers to Group VIA and may include sulfur, selenium, and tellurium, but is not limited thereto.

As used herein, when a definition is not otherwise provided, the term "substituted" refers to a compound or a group or a moiety wherein at least one hydrogen atom thereof is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., one to three) heteroatom(s) including N, O, S, Si, or P.

As used herein, when a definition is not otherwise provided, the term "alkylene group" refers to a straight or branched saturated aliphatic hydrocarbon group having a valence of at least two, optionally substituted with one or more substituents. As used herein, when a definition is not otherwise provided, the term "arylene group" refers to a functional group having a valence of at least two obtained by removal of at least two hydrogens in an aromatic ring, optionally substituted with one or more substituents. As used herein, when a definition is not otherwise provided, the term "alkyl group" refers to a straight or branched saturated aliphatic hydrocarbon group having a valence of one, optionally substituted with one or more substituents.

As used herein, when a definition is not otherwise provided, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, when a definition is not otherwise provided, the term "(meth)acrylate" refers to acrylate and/or methacrylate. The (meth)acrylate can be a (C1 to C10 alkyl)acrylate or a (C1 to C10 alkyl)methacrylate.

A liquid crystal display may have decreased luminous efficiency for example by a color filter layer and accordingly technologies for improving luminous efficiency of a liquid crystal display are desired.

In an embodiment, a layered structure includes a luminescent layer (hereinafter, also referred to as "a photoluminescent layer") having a quantum dot polymer composite pattern; an inorganic layer disposed on the luminescent layer and including an inorganic material; and an organic layer being disposed between the luminescent layer and the inorganic layer and including an organic polymer. The inorganic layer may include a metal oxide, a metal nitride, a metal oxynitride, a metal sulfide, or a combination thereof. The layered structure further includes a substrate (e.g., a transparent and electrically insulative substrate) disposed on a surface of the luminescent layer opposite to the inorganic layer.

The quantum dot polymer composite pattern includes a repeating section including a polymer matrix and a plurality of quantum dots dispersed in the polymer matrix and the repeating section includes a first section configured to emit light of a first light. The repeating section may further include a second section configured to emit light that is different from the first light, a third section configured to emit or transmit a third light is different from the first light and the second light, or a combination thereof. For example, a maximum light emitting, e.g., photoluminescence, peak wavelength of the first light may be from about 580 nm to about 650 nm (e.g., about 620 nm to about 650 nm). The first section may be an R section to emit red light, but is not limited thereto. A maximum light emitting peak wavelength of the second light may be from about 480 nm to about 580 nm (e.g., about 500 nm to about 560 nm). The second section may be a G section to emit green light, but is not limited thereto. The maximum light emitting peak wavelength of the third light may be from about 380 nm to about 480 nm (e.g., about 440 nm to about 480 nm). The third section may emit/transmit blue light, but is not limited thereto.

Figure 2:
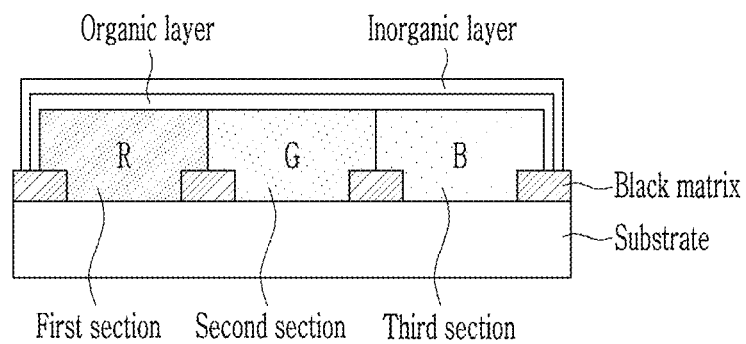
FIG. 2 is a schematic view showing an embodiment of a cross-section of a layered structure.

The inorganic layer may be disposed on or over at least a portion of a surface of the repeating section. In some embodiments, the organic layer may be disposed directly on the surface of the repeating section of the quantum dot polymer composite pattern. The inorganic layer may be disposed directly on the organic layer. At least a portion of a exposed surface of a repeating section (e.g., the first section, the second section, and/or the third section) of the quantum dot polymer composite pattern is coated with the organic layer, and the inorganic layer is disposed (applied) on (or directly on) the organic layer. (see FIG. 1 and FIG. 2)

The (transparent) substrate may be a substrate including an insulation material. The substrate may include a transparent and electrically insulative substrate. The substrate may include glass; various polymers (e.g., a polyester such as polyethylene terephthalate ("PET") and polyethylene naphthalate ("PEN"), a poly(meth)acrylate, a polycarbonate, a polyimide, a polyimide-amide, or the like), a polysiloxane (e.g., polydimethylsiloxane ("PDMS")); an inorganic material such as $Al_2O_3$ or ZnO; or a combination thereof, but is not limited thereto. Herein, the term "transparent" refers to light transmittance of greater than or equal to about 85%, for example, greater than or equal to about 88%, greater than or equal to about 90%, greater than or equal to about 95%, greater than or equal to about 97%, or greater than or equal to about 99% for light having a predetermined wavelength. The predetermined wavelength may have a range determined within about 380 nm to about 780 nm. The range of the predetermined wavelength may be determined considering the light emitted from each of the sections (e.g., red, green, or blue light). A thickness of the (transparent) substrate may be appropriately selected considering a substrate material but is not particularly limited. The substrate may have flexibility.

The photoluminescent layer disposed on the transparent substrate includes a pattern of a quantum dot polymer composite including a plurality of quantum dots dispersed in a polymer matrix.

The polymer matrix may include a cross-linked polymer; and linear polymer having a carboxylic acid group-containing repeating unit. The cross-linked polymer may be a polymer cross-linked by light.

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof. The cross-linked polymer may be a copolymer. The cross-linked polymer may be a polymerization product of a photopolymerizable compound (e.g., a monomer or an oligomer) having one or more, for example, two, three, four, five, six, or more photopolymerizable functional groups (e.g., carbon-carbon double bonds such as (meth)acrylate groups or vinyl groups, or epoxy groups, etc.). The photopolymerizable compound may be a generally-used photopolymerizable monomer or oligomer in a photosensitive resin composition.

In an embodiment, the photopolymerizable compound may include an ethylenic unsaturated monomer such as a (meth)acrylate monomer or a vinyl monomer; a reactive oligomer having two or more photopolymerizable moieties (e.g., an ethylene oxide oligomer, an alkylene oxide oligomer, or the like having epoxy groups, vinyl groups, etc.); a copolymer of the reactive oligomer and the ethylenic unsaturated monomer; a urethane oligomer having two or more photopolymerizable moieties (e.g., (meth)acrylate moieties); a siloxane oligomer having two or more photopolymerizable moieties; or a combination thereof. The photopolymerizable compound may further include a thiol compound having at least two thiol groups at terminal ends. The photopolymerizable compound may be commercially available or may be synthesized by a known method. The cross-linked polymer may be a polymerization product of a mixture including the photopolymerizable compound.

The (meth)acrylate monomer may include a monofunctional or multi-functional ester of (meth)acrylic acid having at least one carbon-carbon double bond. The (meth)acrylate monomer may include a di(meth)acrylate compound, a tri(meth)acrylate compound, a tetra(meth)acrylate compound, a penta(meth)acrylate compound, a hexa(meth)acrylate compound, or a combination thereof. Examples of the (meth)acrylate monomer may be alkyl(meth)acrylate, e.g., a (C1 to C10 alkyl)methacrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritoldi(meth)acrylate, dipentaerythritoltri(meth)acrylate, dipentaerythritolpenta(meth)acrylate, dipentaerythritolhexa(meth)acrylate, bisphenol A epoxy(meth)acrylate, bisphenol A di(meth)acrylate, trimethylolpropanetri(meth)acrylate, novolac epoxy (meth)acrylate, ethyleneglycol monomethylether(meth)acrylate, tris(meth)acryloyloxyethyl phosphate, diethylene glycoldi(meth)acrylate, triethylene glycoldi(meth)acrylate, or propylene glycoldi(meth)acrylate, but are not limited thereto.

The thiol compound having at least two thiol groups at terminal ends may be a compound represented by Chemical Formula 3:

Chemical Formula 3

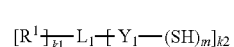

wherein, in Chemical Formula 3, $R^1$ is hydrogen; a substituted or unsubstituted C1 to C40 (or C1 to C30) linear or branched alkyl group; a C2 to C40 (or C1 to C30) linear or branched alkenyl group; a substituted or unsubstituted C6 to C30 aryl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C2 to C30 heterocycloalkyl group; a C1 to C10 alkoxy group; a hydroxy group; $-NH_2$; a substituted or unsubstituted C1 to C30 amine group (—NRR', wherein R and R' are independently hydrogen or a C1 to C30 linear or branched alkyl group, provided that R and R' are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted alkylene group and X is a halogen); —C(=O)OR' (wherein R' is hydrogen or a C1 to C20 linear or branched alkyl group); —CN; C(=O)NRR' or —C(=O)ONRR' (wherein R and R' are independently hydrogen or a C1 to C20 linear or branched alkyl group); or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C2 to C30 heterocycloalkylene group, a substituted or unsubstituted C6 to C30 arylene group, or a substituted or unsubstituted C3 to C30 heteroarylene group wherein at least one methylene (—$CH_2$—) of the substituted or unsubstituted C1 to C30 alkylene group or the substituted or unsubstituted C2 to C30 alkenylene group may be replaced by sulfonyl (—$SO_2$—), carbonyl (CO), ether (—O—), sulfide (—S—), sulfoxide (—SO—), ester (—C(=O)O—), amide (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; or a C2 to C30 alkylene group or a C3 to C30 alkenylene group wherein at least one methylene (—$CH_2$—) is replaced by a sulfonyl (—$S(=O)_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that when $Y_1$ is not a single bond, m does not exceed the valence of $Y_1$ and provided that the sum of k1 and k2 does not exceed the valence of $L_1$.

The thiol compound may include a compound represented by Chemical Formula 3-1:

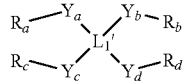

Chemical Formula 3-1 wherein, in Chemical Formula 3-1, $L_1'$ is carbon, a substituted or unsubstituted C2 to C20 alkylene moiety, a substituted or unsubstituted C6 to C30 arylene moiety; a substituted or unsubstituted C3 to C30 heteroarylene moiety; a substituted or unsubstituted C3 to C30 cycloalkylene moiety; a substituted or unsubstituted C2 to C30 heterocycloalkylene moiety; or a substituted or unsubstituted C2 to C30 heterocycloalkylene moiety, each of $Y_a$ to $Y_d$ is independently a direct bond; a substituted or unsubstituted C1 to C30 alkylene group; a substituted or unsubstituted C2 to C30 alkenylene group; or a C2 to C30 alkylene group or a C3 to C30 alkenylene group wherein at least one methylene (—$CH_2$—) is replaced by an sulfonyl (—$S(=O)_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, and each of $R_a$ to $R_d$ is independently $R^1$ of Chemical Formula 1 or SH, provided that at least two of $R_a$ to $R_d$ are SH.

The thiol compound may be a dithiol compound, a trithiol compound, a tetrathiol compound, or a combination thereof. For example, the multi-thiol compound may be glycol di-3-mercaptopropionate, glycol dimercapto acetate, trimethylol propane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof. A reaction between the thiol compound and the ethylenic unsaturated monomer may provide a thiol-ene resin.

The linear polymer having a carboxylic acid group-containing repeating unit (hereinafter, also referred to as a carboxylic acid polymer or a binder) may be a copolymer of monomer mixture of a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

The carboxylic acid group-containing repeating unit may be derived from a monomer including a carboxylic acid group and a carbon-carbon double bond, a monomer having a dianhydride moiety, or a combination thereof.

Examples of the first monomer may include carboxylic acid vinyl ester compounds such as acrylic acid, methacrylic acid, maleic acid, itaconic acid, fumaric acid, 3-butenoic acid, vinyl acetate, or vinyl benzoate, but are not limited thereto. The first monomer may be at least one compound, e.g., two or more different compounds.

Examples of the second monomer may be an alkenyl aromatic compound such as styrene, α-methyl styrene, vinyl toluene, or vinyl benzyl methyl ether; an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; an unsaturated imide compound such as N-phenylmaleimide, N-benzylmaleimide, or N-alkylmaleimide; an unsaturated carboxylic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto. As the second monomer, at least one compound, e.g., two or more different compounds may be used.

Examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, at least one compound, e.g., two or more different compounds may be used.

The copolymer may include a first repeating unit derived from the first monomer, a second repeating unit derived from the second monomer, and optionally a third repeating unit derived from the third monomer. In the copolymer, a content of the first repeating unit may be greater than or equal to about 5 mol %, greater than or equal to about 10 mol %, for example, greater than or equal to about 15 mol %, greater than or equal to about 25 mol %, or greater than or equal to about 35 mol %. In the carboxylic acid polymer, a content of the first repeating unit may be less than or equal to about 95 mol %, for example, less than or equal to about 90 mol %, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, a content of the second repeating unit may be greater than or equal to about 5 mol %, for example, greater than or equal to about 10 mol %, greater than or equal to about 15 mol %, greater than or equal to about 25 mol %, or greater than or equal to about 35 mol %. In the binder polymer, a content of the second repeating unit may be less than or equal to about 95 mol %, for example, less than or equal to about 90 mol %, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, if it is present, a content of the third repeating unit may be greater than or equal to about 1 mol %, for example, greater than or equal to about 5 mol %, greater than or equal to about 10 mol %, or greater than or equal to about 15 mol %. In the binder polymer, a content of the third repeating unit, if present, may be less than or equal to about 20 mol %, for example, less than or equal to about 15 mol %, or less than or equal to about 10 mol %.

The copolymer may be a copolymer of (meth)acrylic acid and; at least one second/third monomer including an arylalkyl(meth)acrylate, hydroxyalkyl (meth)acrylate, and styrene. For example, the binder polymer may be a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer or a combination thereof.

The carboxylic acid polymer may include a multiple aromatic ring-containing polymer. The multiple aromatic ring-containing polymer has a backbone structure where two aromatic rings are bound to a quaternary carbon atom that is a constituent atom of another cyclic moiety in the main chain (e.g., being bound to the main chain) and includes a carboxylic acid group (—COOH).

In the multiple aromatic ring-containing polymer, the backbone structure may be represented by Chemical Formula A:

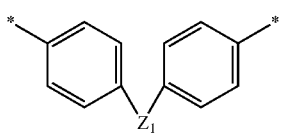

Chemical Formula A wherein, * is a portion that is linked to an adjacent atom of the main chain of the binder, and $Z_1$ is a linking moiety represented by any one of Chemical Formulae A-1 to A-6, and in Chemical Formulae A-1 to A-6, * is a portion that is linked to an aromatic moiety:

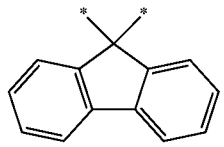

Chemical Formula A-1

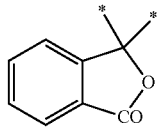

Chemical Formula A-2

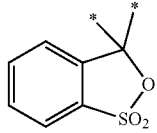

Chemical Formula A-3

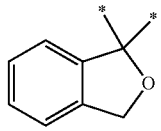

Chemical Formula A-4

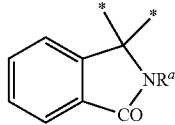

Chemical Formula A-5 wherein, $R^a$ is a hydrogen, an ethyl group, $C_2H_4Cl$, $C_2H_4OH$, $CH_2CH=CH_2$, or a phenyl group,

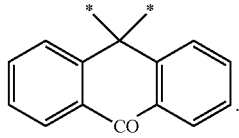

Chemical Formula A-6

The multiple aromatic ring-containing polymer may include a repeating unit represented by Chemical Formula B:

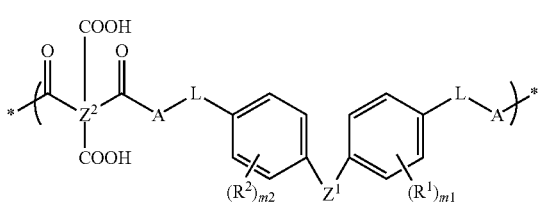

Chemical Formula B wherein $Z^1$ is a linking moiety represented by any one of Chemical Formulae A-1 to A-6, L is a direct bond, a C1 to C10 alkylene, a C1 to C10 alkylene having a substituent including a carbon-carbon double bond, a C1 to C10 oxyalkylene, or a C1 to C10 oxyalkylene having a substituent including a carbon-carbon double bond, A is —NH—, —O—, a C1 to C10 alkylene, a combination thereof and $Z^2$ is a C6 to C40 aromatic organic group.

each of $R^1$ and $R^2$ is independently hydrogen, a halogen, or a substituted or unsubstituted C1 to C20 alkyl group, m1 and m2 are independently an integer ranging from 0 to 4.

In Chemical Formula B, $Z^2$ may be any one of Chemical Formula [B-1], Chemical Formula [B-2] and Chemical Formula [B-3]:

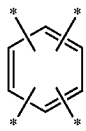

Chemical Formula B-1 wherein * is a portion that is linked to an adjacent carbonyl carbon,

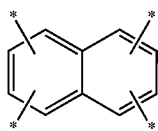

Chemical Formula B-2 wherein * is a portion that is linked to an adjacent carbonyl carbon,

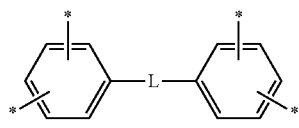

Chemical Formula B-3 wherein * is a portion that is linked to an adjacent carbonyl carbon, L is a direct bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein each R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula C:

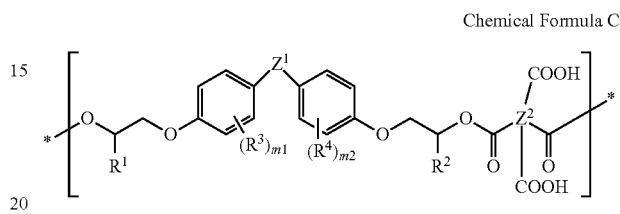

Chemical Formula C wherein each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ is a linking moiety represented by Chemical Formulae A-1 to A-6, $Z^2$ is an C6 to C40 aromatic organic group such as the moieties set forth above, and m1 and m2 are independently an integer ranging from 0 to 4.

In an embodiment, the multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyldianhydride and/or phthalic anhydride. The reaction scheme may be summarized as below:

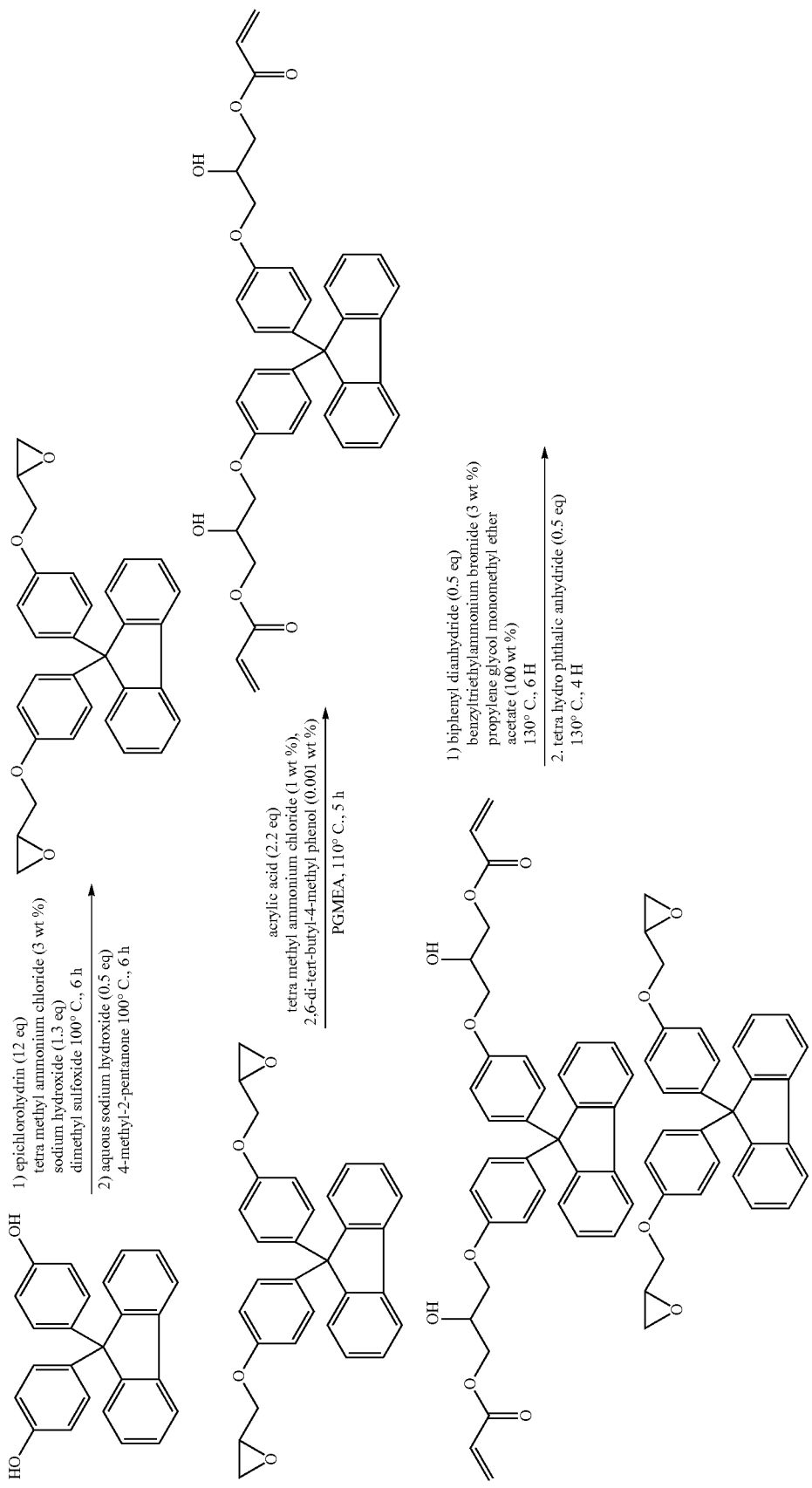

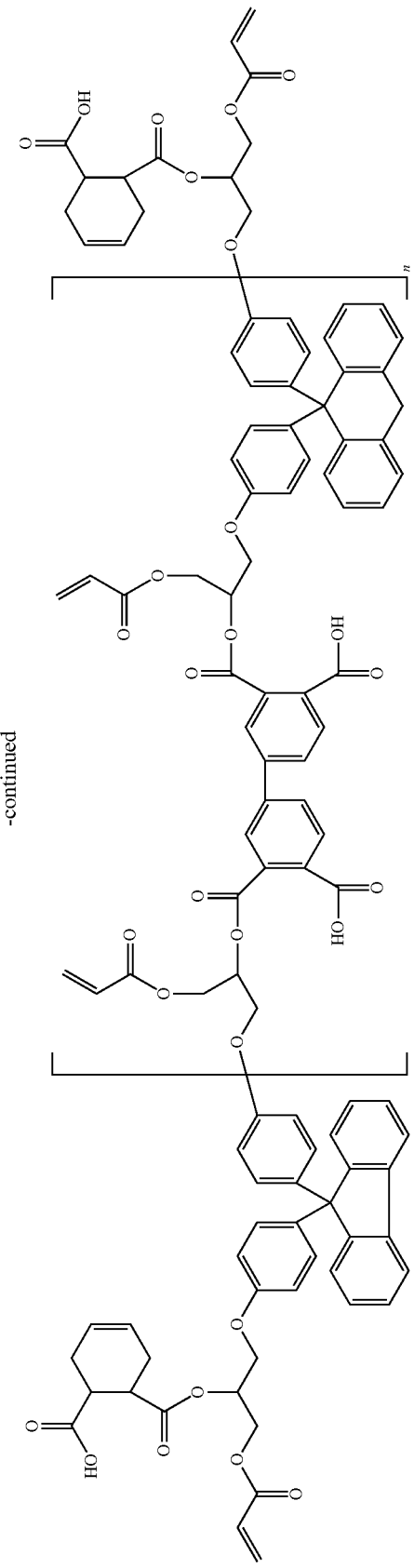

The multiple aromatic ring-containing polymer may include a functional group represented by Chemical Formula D at one or both terminal ends:

Chemical Formula D

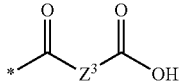

wherein, in Chemical Formula D, $Z^3$ is a moiety represented by one of Chemical Formulae D-1 to D-7:

Chemical Formula D-1

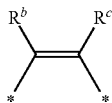

wherein, $R^b$ and $R^c$ are independently hydrogen, a substituted or unsubstituted C1 to C20 alkyl group, an ester group, or an ether group.

Chemical Formula D-2

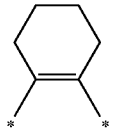

Chemical Formula D-3

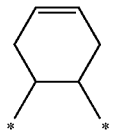

Chemical Formula D-4

Chemical Formula D-5

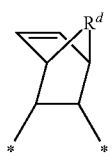

wherein, $R^d$ is O, S, NH, a substituted or unsubstituted C1 to C20 alkylene group, a C1 to C20 alkylamine group or a C2 to C20 alkenylamine group.

Chemical Formula D-6

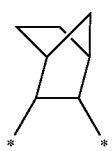

Chemical Formula D-7

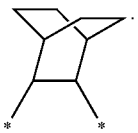

The multiple aromatic ring-containing polymer may be synthesized by a known method or is commercially available (e.g., from Nippon Steel Chemical Co., Ltd.).

The multiple aromatic ring-containing polymer may include a reaction product of a fluorene compound including 9,9-bis(4-hydroxyphenyl)fluorene, 9,9-bis(4-aminophenyl) fluorene, 9,9-bis[4-(glycidyloxy)phenyl]fluorene, and 9,9-bis[4-(2-hydroxyethoxy)phenyl]fluorene with an appropriate compound capable of reacting with the fluorene compound (e.g., an aromatic dianhydride including 9,9-bis-(3,4-dicarboxyphenyl)fluorene dianhydride, pyromellitic dianhydride ("PMDA"), biphenyltetracarboxylic dianhydride ("BPDA"), benzophenone tetracarboxylic dianhydride, and naphthalenetetracarboxylic dianhydride, a C2 to C30 diol compound, epichlorohydrin, or the like).

The fluorene compound, dianhydrides, a diol compound, and the like are commercially available, and the reaction conditions therebetween are known in the art.

An acid value of the carboxylic acid polymer may be greater than or equal to about 50 mg KOH/g. For example, the acid value of the carboxylic acid polymer may be greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The acid value of the polymer may be for example less than or equal to about 200 mg KOH/g, for example, less than or equal to about 190 mg KOH/g, less than or equal to about 180 mg KOH/g, or less than or equal to about 160 mg KOH/g.

The quantum dot (hereinafter, referred to as a semiconductor nanocrystal) disposed (e.g., dispersed) in the polymer matrix is not particularly limited. The quantum dot may be synthesized by a known method or commercially available.

The quantum dot may include a Group II-VI compound, a Group III-V compound, a Group IV-VI compound, a Group IV element or compound, a Group I-III-VI compound, a Group I-II-IV-VI compound, or a combination thereof. The quantum dot may not include cadmium.

The Group II-VI compound may be selected from a binary element compound including CdSe, CdTe, ZnS, ZnSe, ZnTe, ZnO, HgS, HgSe, HgTe, MgSe, MgS, or a mixture thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary element compound including ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include Group III metal.

The Group III-V compound may be selected from a binary element compound including GaN, GaP, GaAs, GaSb, AlN, AlP, AlAs, AlSb, InN, InP, InAs, InSb, or a mixture thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (e.g., InZnP).

The Group IV-VI compound may be selected from a binary element compound including SnS, SnSe, SnTe, PbS, PbSe, PbTe, or a mixture thereof; a ternary element compound including SnSeS, SnSeTe, SnSTe, PbSeS, PbSeTe, PbSTe, SnPbS, SnPbSe, SnPbTe, or a mixture thereof; and a quaternary element compound including SnPbSSe, SnPbSeTe, SnPbSTe, or a mixture thereof.

Examples of the Group I-III-VI compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto.

The Group IV element or compound may be selected from a single-element compound including Si, Ge, or a mixture thereof; and a binary element compound including SiC, SiGe, or a mixture thereof.

The binary element compound, the ternary element compound or the quaternary element compound respectively exist in a uniform concentration in the particle or partially different concentrations in the same particle. The semiconductor nanocrystal particle may have a core-shell structure wherein a first semiconductor nanocrystal may be surrounded by a second semiconductor nanocrystal that may be different from the first semiconductor nanocrystal. The interface between the core and the shell may have a concentration gradient wherein the concentration of an element of the shell may change in a radial direction.

The semiconductor nanocrystal may include a core and a multi-layered shell surrounding the same. The multi-layered shell refers a shell including two or more layers. The adjacent layers may have the different composition from each other. At least one layer of the multi-layered shell may have a single composition, an alloying composition, or a gradient alloy composition.

In a core-shell quantum dot, a compound of the shell may have a greater energy bandgap than a compound of the core. In the core-shell quantum dot, a compound of the shell may have a smaller energy bandgap than a compound of the core. In the multi-layered shell, an outer shell of a core may have a greater energy bandgap than a shell near to a core, but is not limited thereto.

The semiconductor nanocrystal may have quantum efficiency of greater than or equal to about 10%, for example, greater than or equal to about 30%, greater than or equal to about 50%, greater than or equal to about 60%, greater than or equal to about 70%, greater than or equal to about 90%, or about 100%. For use in display devices, the semiconductor nanocrystal may have a narrower spectrum so as to realize enhanced color purity or color reproducibility. The semiconductor nanocrystal may have a full width at half maximum ("FWHM") of a light emitting wavelength spectrum of less than or equal to about 45 nm, for example less than or equal to about 40 nm, less than or equal to about 35 nm, or less than or equal to about 30 nm. Within such ranges, a device including the semiconductor nanocrystal may have enhanced color purity or improved color reproducibility.

The quantum dot may have a particle size (the particle diameter for a spherical particle, and in the case of a non-spherical particle, a diameter calculated from an area of a two dimensional TEM image) of about 1 nm to about 100 nm. For example, the quantum dot may have a particle size of about 1 nm to about 20 nm. The quantum dot may have a particle size of greater than or equal to about 2 nm, or greater than or equal to about 3 nm and less than or equal to about 15 nm, less than or equal to about 14 nm, less than or equal to about 13 nm, less than or equal to about 12 nm, less than or equal to about 10 nm, or less than or equal to about 9 nm.

A shape of the quantum dot is not particularly limited. In an embodiment, the quantum dot may have a spherical shape, an ellipsoidal shape, a pyramidal shape, multi-armed (multi-pod) shape, cubic shape, a polygonal shape, a nanorod, a nanotube, a nanowire, a nanofiber, a nanosheet, or a combination thereof.

The quantum dot may be commercially available or may be synthesized in any method. For example, quantum dots may be a colloidal particle synthesized according to a wet chemical process. In the wet chemical process, precursors react in an organic solvent to grow nanocrystal particles, and the organic solvent or a ligand compound may coordinate (or be bound) to the surface of the quantum dot, controlling the growth of the nanocrystal. Examples of the organic solvent and the ligand compound are known. In the wet chemical process, the synthesized colloidal quantum dot may be collected by adding a non-solvent to a reaction solution and centrifuging a final mixture. Such a collecting process may cause removal of at least a portion of the organic materials coordinated on the surface of the quantum dot. Examples of the non-solvent may be acetone, ethanol, methanol, and the like, but are not limited thereto.

The quantum dot may have an organic ligand bound or coordinated to its surface. In an embodiment, the organic ligand may have a hydrophobic moiety. The organic ligand may be RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently hydrogen, a C5 to C24 substituted or unsubstituted aliphatic hydrocarbon group, for example a C5 to C24 alkyl group, a C5 to C24 alkenyl group, or a C5 to C20 aromatic hydrocarbon group, for example a C6 to C20 aryl group, provided that at least one R is not hydrogen), or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; an alkyl phosphine compound such as methyl phosphine, ethyl phosphine, propyl phosphine, butyl phosphine, pentyl phosphine, octylphosphine, dioctyl phosphine, tributylphosphine, or trioctylphosphine; a phosphine oxide compound such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide; diphenyl phosphine, triphenyl phosphine, or oxide compounds thereof; a C5 to C20 alkyl phosphonic acid such as hexylphosphonic acid, octylphosphonic acid, dodecylphosphonic acid, tetradecylphosphonic acid, hexadecylphosphinic acid, or octadecylphosphonic; a mono- or di(C5 to C20 alkyl) phosphinic acid such as (mono- or di)hexylphosphinic acid, (mono- or di)octylphosphinic acid, (mono- or di)dodecylphosphinic acid, (mono- or di)(tetradecyl)phosphinic acid, (mono- or di)(hexadecyl)phosphinic acid, or (mono- or di)(octadecyl)phosphinic acid; and the like, but are not limited thereto. The quantum dot may include the organic ligand alone or as a mixture of two or more.

The photoluminescent layer including the quantum dot-polymer composite pattern may have potential utility in a color filter of a liquid crystal display. A conventional liquid crystal display device includes a backlight unit, a liquid crystal layer, and an absorption-type color filter. When white light emitted from a backlight unit passes an absorption-type color filter, light in a predetermined wavelength may transmit and the rest of light may be absorbed, and thereby a predetermined color in each pixel may be realized. In such a liquid crystal display device, the absorption-type color filter may cause substantial luminous efficiency deterioration.

The quantum dot may have a theoretical quantum yield ("QY") of about 100%, and may emit light having high color purity (e.g., a full width at half maximum ("FWHM") of less than or equal to about 40 nm). When the photoluminescent layer having the quantum dot-polymer composite is used as a color filter, a display device having a wider viewing angle and more enhanced brightness may be realized. The color filter having the photoluminescent layer may increase luminous efficiency of a device and improve color reproducibility of a device in comparison with a color filter including light absorption-type material.

However, light emitting properties of the quantum dot may be adversely affected by heat and/or an external environment (e.g., matrix, oxygen, moisture, and the like) compared with those of an absorption-type color filter material. In order to realize a display device having enhanced brightness, a quantum dot-polymer matrix pattern may be required to maintain a high photoconversion efficiency, but a final quantum dot-polymer composite pattern obtained through each and every process (of preparation of a composition for forming a light-based pattern, subsequently heat-treatment, and the like) may show a significantly decreased photoconversion efficiency and/or a maintenance percentage thereof with respect to its original value.

Forming a pattern of a quantum dot polymer composite by using an alkaline developing liquid may entail a thermal process at a high temperature of greater than or equal to about 200° C. Cadmium-free quantum dots (e.g., quantum dots including a Group III-V core such as InP) may have inferior thermal/chemical stability compared to cadmium-based quantum dots and thus may show sharply decreased light conversion efficiency even with a heat-treating at a relatively low temperature of less than or equal to about 200° C., which may lead to decreased brightness in the display device. Without wishing to be bound by any theory, such a decrease in the photo-efficiency may be resulted from ligand detachment, oxidation, or thermal decomposition of the quantum dots. Accordingly, using a color filter with the quantum dot-polymer composite pattern has been very limited so far.

In a layered structure according to an embodiment, an inorganic layer including an inorganic material (e.g., essentially consisting of or consisting of an inorganic material) may be provided (for example, directly) on the photoluminescent layer (e.g., on the quantum dot polymer composite pattern or on a surface of each section in the pattern), and the foregoing structure may contribute to reduction/prevention of a decrease in the light emitting properties of the quantum dot.

The inorganic material may include a metal oxide, a metal nitride, a metal oxynitride, a metal sulfide, or a combination thereof. The inorganic material may have a refractive index of about 1.4 to about 3.0. The inorganic material may include a silicon oxide, a silicon nitride, a silicon oxynitride, a hafnium oxide, a tantalum oxide, a titanium oxide such as titanium dioxide, a zirconium oxide, a zinc oxide, a zinc sulfide, a magnesium oxide, a cesium oxide, a lanthanum oxide, an indium oxide, a niobium oxide, an aluminum oxide, or a combination thereof. The inorganic layer may include a continuous film of the inorganic material.

Figure 3:
FIG. 3 is a schematic view showing an embodiment of a cross-section of an organic layer and a multi-layered inorganic film in a layered structure of embodiments.

The inorganic layer may include at least two (e.g., three, four, five, six, seven, or more) layers each including the same or different inorganic material. The adjacent layers 1 and 2 may be different in a composition of the inorganic material, refractive index, transmittance, a thickness, or combination thereof of the inorganic material. (See: FIG. 3)

Subsequent lamination of the inorganic layer after the lamination of the photoluminescent layers and/or the organic layer on the transparent substrate may cause a stress. In the adjacent layers, controlling a composition of the inorganic material, a refractive index, a thickness, or combination thereof of each layer may allow to control (e.g., minimize) the stress. In addition, the inorganic layer may play a role of a dichroic filter or a dichroic reflector by adjusting a composition of the inorganic material, a refractive index, or combination thereof of each layer in the adjacent layers. By adjusting a composition, a refractive index, transmittance, a thickness, and the like of each layer, a total light transmittance (e.g., regarding excitation light) may be maintained at a level of greater than or equal to about 90%, for example, greater than or equal to about 95%, or even greater than or equal to about 99% while the transmission of oxygen and moisture may be suppressed. The quantum dot included in the photoluminescent layer may emit light in all directions. When the inorganic layer of the layered structure plays a role of a dichroic filter and/or reflector, light of a predetermined wavelength emitted by the photoluminescent layer (e.g., green light or red light) may be mostly reflected in a predetermined direction (e.g., a front direction of a liquid crystal display device that will be described later), which may bring forth an increase in terms of light utilization efficiency.

In an embodiment, the inorganic layer may include a first layer including a first inorganic material and a second layer including a second inorganic material, directly contacting the first layer, and having a different refractive index from the first layer by at least about 0.5. The inorganic layer may include the first layer and the second layer disposed alternately.

The first inorganic material may have a composition different from that of the second inorganic material. The first inorganic material may have a lower refractive index than the second inorganic material. In an embodiment, the capping layer may include a plurality of layers having a different refractive index with each other. For example, two layers having a different refractive index with each other (e.g., a layer including a material having a high refractive index and a layer including a material having a relatively low refractive index) may be alternately laminated.

The first inorganic material may include a silicon oxide. The second inorganic material may include a hafnium oxide, a tantalum oxide, a titanium oxide, a zirconium oxide, a magnesium oxide, a cesium oxide, a lanthanum oxide, an indium oxide, a niobium oxide, an aluminum oxide, a silicon nitride, or a combination thereof.

In the multi-layered inorganic layer, a thickness of each layer and the number of layers may be determined considering a refractive index or a reflection wavelength of each layer. A thickness of the first layer (or the second layer) may be greater than or equal to about 3 nm, for example, greater than or equal to about 5 nm, greater than or equal to about 10 nm, greater than or equal to about 20 nm, or greater than or equal to about 30 nm. A thickness of the first layer (or the second layer) may be less than or equal to about 1,000 nm, less than or equal to about 900 nm, less than or equal to about 800 nm, less than or equal to about 700 nm, less than or equal to about 600 nm, less than or equal to about 500 nm, less than or equal to about 400 nm, or less than or equal to about 300 nm. A thickness of the first layer may be from about 300 nm and a thickness of the second layer may be from about 3 nm to about 300 nm. The thickness of the first layer may be greater than the thickness of the second layer. The thickness of the first layer may be smaller than the thickness of the second layer.

A total thickness of the inorganic layer may be greater than or equal to about 100 nm, for example, greater than or equal to about 200 nm, or greater than or equal to about 300 nm. A total thickness of the inorganic layer may be less than or equal to about 10,000 nm, less than or equal to about 8,000 nm, less than or equal to about 6,000 nm, less than or equal to about 5,000 nm, less than or equal to about 4,000 nm, or less than or equal to about 3,000 nm.

The inorganic layer may have a transmittance of greater than or equal to about 90%, for example, greater than or equal to about 95%, greater than or equal to about 96%, greater than or equal to about 97%, greater than or equal to about 98%, or greater than or equal to about 99% for light having a wavelength of greater than or equal to about 380 nm (e.g., greater than or equal to about 390 nm, greater than or equal to about 400 nm, greater than or equal to about 410 nm, greater than or equal to about 420 nm, or greater than or equal to about 430 nm) and less than or equal to about 520 nm (e.g., less than or equal to about 510 nm, less than or equal to about 500 nm, less than or equal to about 490 nm, or less than or equal to about 480 nm).

The layered structures of the embodiments include an organic layer that is disposed between the photoluminescent layer and the inorganic layer and includes an organic polymer. The organic layer may control a surface state of the photoluminescent layer and contribute the planarization of the photoluminescent layer. In some embodiments, a planarization degree (e.g., a surface roughness) of the organic layer may be less than about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm. The surface planarization of the luminescent layer may prevent or decrease cracks or voids that may otherwise occur in the layers stacked in subsequent processes. The planarization of the inorganic layer (e.g., a surface roughness of the inorganic layer) may be less than about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm. The surface roughness may be determined by using a surface profiler such as Atomic Force Microscope or an alpha step with respect to a predetermined area (e.g., about 3 μm$^2$). The presence of the organic layer makes it possible for the inorganic layer to provide better and uniform capping with the photoluminescent layer, thereby enhancing the protection effect for the quantum dot polymer composite.

The organic polymer of the organic layer may include an aliphatic hydrocarbon backbone chain, an aliphatic hydrocarbon backbone chain having a carbonyl group, an ester group, an ether group, a thioether group, an arylene group, an alicyclic hydrocarbon group, or a combination thereof interposed therein, a siloxane backbone having an organic side chain attached to a silicon atom, or a combination thereof. The organic polymer of the organic layer may include a crosslinked organic polymer.

The organic polymer may include a unit represented by Chemical Formula 1:

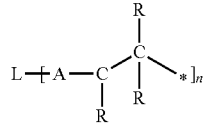

Chemical Formula 1 wherein L is a substituted or unsubstituted (e.g., greater than or equal to C1, greater than or equal to C2, greater than or equal to C3, greater than or equal to C4, greater than or equal to C5, greater than or equal to C6, greater than or equal to C7, greater than or equal to C8, greater than or equal to C9, greater than or equal to C10, greater than or equal to C20, greater than or equal to C30, greater than or equal to C40, greater than or equal to C50 and less than or equal to about C100, for example, less than or equal to about C90, less than or equal to about C80, less than or equal to about C70, less than or equal to about C60, or less than or equal to about C50) aliphatic hydrocarbon (e.g., alkylene, alkenylene, or alkynylene) moiety; a substituted or unsubstituted (e.g., greater than or equal to C2, greater than or equal to C3, greater than or equal to C4, greater than or equal to C5, greater than or equal to C6, greater than or equal to C7, greater than or equal to C8, greater than or equal to C9, greater than or equal to C10, greater than or equal to C20, greater than or equal to C30, greater than or equal to C40, greater than or equal to C50 and less than or equal to about C100, for example, less than or equal to about C90, less than or equal to about C80, less than or equal to about C70, less than or equal to about C60, or less than or equal to about C50) aliphatic hydrocarbon (e.g., alkylene, alkenylene, or alkynylene) moiety wherein at least one methylene group is replaced with an ester group, an ether group, a carbonyl group, an amide group, or a combination thereof; a substituted or unsubstituted (e.g., greater than or equal to C1, greater than or equal to C2, greater than or equal to C3, greater than or equal to C4, greater than or equal to C5, greater than or equal to C6, greater than or equal to C7, greater than or equal to C8, greater than or equal to C9, greater than or equal to C10, greater than or equal to C20, greater than or equal to C30, greater than or equal to C40, greater than or equal to C50 and less than or equal to about C100, for example, less than or equal to about C90, less than or equal to about C80, less than or equal to about C70, less than or equal to about C60, or less than or equal to about C50) alkylene oxide moiety, a substituted or unsubstituted poly(mono, di, tri, tetra, penta, hexa, hepta, octa, nona, deca, or greater) alkylene oxide (e.g., polyethylene oxide, polypropylene oxide) moiety, a substituted or unsubstituted heterocyclic (e.g., tetrahydrofurfuryl) moiety, a cyclic trimethylolpropane moiety, a substituted or unsubstituted (e.g., greater than or equal to C3, greater than or equal to C4, greater than or equal to C5, greater than or equal to C6, greater than or equal to C7, greater than or equal to C8, greater than or equal to C9, greater than or equal to C10, greater than or equal to C20, greater than or equal to C30, greater than or equal to C40, greater than or equal to C50 and less than or equal to about C100, for example, less than or equal to about C90, less than or equal to about C80, less than or equal to about C70, less than or equal to about C60, or less than or equal to about C50) alicyclic moiety (e.g., an isobornyl moiety, a norbornane moiety, a norbornene moiety, a tricyclodecane moiety, a cyclohexane moiety), a substituted or unsubstituted (e.g., greater than or equal to C6, greater than or equal to C7, greater than or equal to C8, greater than or equal to C9, greater than or equal to C10, greater than or equal to C20, greater than or equal to C30, greater than or equal to C40, greater than or equal to C50 and less than or equal to about C100, for example, less than or equal to about C90, less than or equal to about C80, less than or equal to about C70, less than or equal to about C60, or less than or equal to about C50) aromatic hydrocarbon group (e.g., aryl, arylene, or benzene), an organic siloxane moiety (e.g., a polydimethylsiloxane moiety), or a combination thereof, R is the same or different and each is independently hydrogen or a C1 to C10 alkyl group, A is a single bond, a C1 to C10 alkylene group, an ether group, a carbonyl group, an ester group, —NH—, or an amide group, or a combination thereof,

* is a portion that is linked to an adjacent unit in the polymer, and n is an integer of greater than or equal to 1 and less than or equal to 6.

The organic polymer may include a unit represented by Chemical Formula 1-1, a unit represented by Chemical Formula 1-2, or a combination thereof:

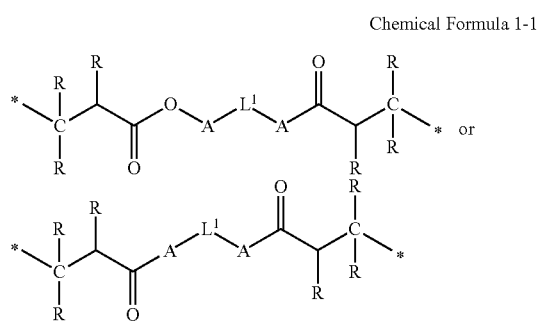

Chemical Formula 1-1 wherein $L^1$ is a C1 to C40 alkylene, a C1 to C40 alkenylene, —($R^1$O)n- (where R is a C1 to C10 alkylene, n is an integer from 1 to 20), —($R^2$O)n-($CR^3_2$)—($R^4$O)m- (where $R^2$ and $R^4$ are the same or different and each independently a C1 to C10 alkylene, $R^3$ are the same or different and each is independently hydrogen or a C1 to C10 alkyl group, and n is an integer from 1 to 20), or a combination thereof, R is the same or different and each is independently hydrogen or a C1 to C10 alkyl group, A is the same or different and each is independently a single bond, —O—, —NH— or a combination thereof; and

* is a portion that is linked to an adjacent unit in the polymer,

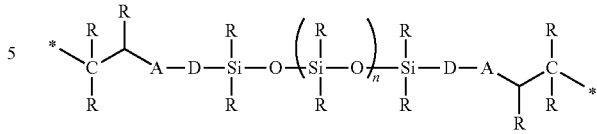

Chemical Formula 1-2

A is the same or different and each is independently a single bond, a C1 to C10 alkylene group, an ether group, a carbonyl group, an ester group, or a combination thereof, R is the same or different and each is independently hydrogen or a C1 to C10 alkyl group, D is the same or different and each is independently a single bond, a C1 to C10 alkylene group, a C1 to C10 alkylene group substituted with a hydroxyl group, or a combination thereof, wherein in the C1 to C10 alkylene group or the C1 to C10 alkylene group substituted with a hydroxyl group, at least one methylene units may be replaced with an ether group, and

* is a portion that is linked to an adjacent unit in the polymer.

The organic polymer may include a polymer obtained by polymerization (e.g., photopolymerization) of a compound represented by Chemical Formula 2 described below.

A thickness of the organic layer may be less than or equal to about 3 μm, for example, less than or equal to about 2.5 μm, less than or equal to about 2 μm, less than or equal to about 1.9 μm, less than or equal to about 1.8 μm, less than or equal to about 1.7 μm, less than or equal to about 1.6 μm, less than or equal to about 1.5 μm, less than or equal to about 1.4 μm, less than or equal to about 1.3 μm, less than or equal to about 1.2 μm, less than or equal to about 1.1 μm, less than or equal to about 1 μm, less than or equal to about 0.9 μm, less than or equal to about 0.8 μm, less than or equal to about 0.7 μm, less than or equal to about 0.6 μm, less than or equal to about 0.5 μm, less than or equal to about 0.4 μm, less than or equal to about 0.3 μm, less than or equal to about 0.2 μm, or less than or equal to about 0.1 μm. The organic layer may have a surface roughness of less than or equal to about 100 nm. A thickness of the organic layer may be greater than or equal to about 5 nm, for example, greater than or equal to about 10 nm, greater than or equal to about 20 nm, greater than or equal to about 30 nm, greater than or equal to about 40 nm, greater than or equal to about 50 nm, greater than or equal to about 60 nm, greater than or equal to about 70 nm, greater than or equal to about 80 nm, or greater than or equal to about 90 nm.

In the layered structure of the embodiment, a surface of the photoluminescent layer may include a defect such as voids or bump. When the inorganic layer is formed on the photoluminescent layer having the voids and/or the bumps, the surface of the inorganic layer tends to include defects corresponding to the surface defect of the photoluminescent layer. When the layered structure includes a multi-layered inorganic film as later described, such defects may grow to form a crack at the cross-section of the layered structure. In the case of the layered structure of the embodiments, the organic layer may reduce or prevent the surface defects on the photoluminescent layer and thereby the occurrence of the crack may be avoid or suppressed in the cross-section of the layered structure. Accordingly, when being observed with an electronic microscope, the cross-section of the layered structure may not show defects of the inorganic layer that correspond to the surface defect of the photoluminescent layer.

A layered structure according to an embodiment may include an overcoat layer on the inorganic layer for example so as to realize planarization. The overcoat layer may include an organic polymer. The organic polymer may include any optically transparent polymer, but is not particularly limited. For example, the organic polymer may be a thermosetting resin and an ultraviolet ("UV") curable resin. The thermosetting resin and ultraviolet ("UV") curable resin for the overcoat layer ("OCL") may include a urethane (meth)acrylate resin, a perfluoropolymer having a (meth)acrylate group, poly(meth)acrylate having a (meth)acrylate group, an epoxy(meth)acrylate polymer, or a combination thereof. A thickness of the overcoat layer is not particularly limited and may be appropriately selected. For example, the thickness of the overcoat layer may be different in accordance with a thickness or planarity of a color filter, and may be less than or equal to about 5 μm, for example, less than or equal to about 4 μm, or less than or equal to about 3 μm, but is not limited thereto. The thickness of the overcoat layer may be greater than or equal to about 10 nm, greater than or equal to about 50 nm, greater than or equal to about 80 nm, or greater than or equal to about 100 nm but is not limited thereto.

According to an embodiment, the layered structure may show an improved light conversion maintenance percentage after a heat treatment at an increased temperature (e.g., greater than or equal to about 160° C., even greater than or equal to about 180° C., or greater than or equal to about 200° C.).

The layered structure may further include an overcoat for planarization over the inorganic layer.

In an embodiment, a method of producing the layered structure includes applying a composition including a plurality of quantum dots, a photopolymerizable monomer including at least two polymerizable moieties, a linear polymer including a carboxylic acid group-containing repeating unit (e.g., a carboxylic acid linear polymer), a photoinitiator, and an organic solvent, on a substrate to form a film;

exposing a predetermined region of the formed film to light (e.g., having a wavelength of less than about 410 nm) to polymerize and cross-link in the exposed predetermined region and to form a quantum dot polymer composite dispersed in a polymer matrix;

removing an unexposed region from the film using an alkali aqueous solution to obtain a quantum dot-polymer composite pattern;

heat-treating the quantum dot-polymer composite pattern to remove an organic solvent;

forming an organic layer including an organic polymer on the heat-treated quantum dot-polymer composite pattern; and forming an inorganic layer including the inorganic material on the organic layer.

In the method, the series of the processes may be repeated at least twice so that the quantum dot polymer composite pattern of the photoluminescent layer may have a plurality of sections (e.g., a first section, a second section, or optionally a third section).

The quantum dot, the photopolymerizable compound, the carboxylic acid polymer (binder), the transparent substrate, the polymer matrix, the quantum dot-polymer composite, and the inorganic layer may be the same as explained above.

The composition includes a photoinitiator. Types of the photoinitiator are not particularly limited, and may be selected appropriately. For example, the available photoinitiator may include a triazine compound, an acetophenone compound, a benzophenone compound, a thioxanthone compound, a benzoin compound, an oxime compound, or a combination thereof, but it is not limited thereto.

Examples of the triazine compound may include 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, 2,4-bis(trichloro methyl)-6-styryl-s-triazine, 2-(naphtho1-yl)-4,6-bis(trichloro methyl)-s-triazine, 2-(4-methoxy naphtho1-yl)-4,6-bis(trichloro methyl)-s-triazine, 2,4-bis (trichloro methyl)-6-(piperonyl)-s-triazine, or 2,4-bis (trichloro methyl)-6-(4'-methoxy styryl)-s-triazine but it is not limited thereto.

Examples of the acetophenone compound may be 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, but are not limited thereto.

Examples of the benzophenone compound may be benzophenone, benzoyl benzoate, methyl benzoyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, but are not limited thereto.

Examples of the thioxanthone compound may be thioxanthone, 2-methyl thioxanthone, 2-isopropyl thioxanthone, 2,4-diethyl thioxanthone, 2,4-diisopropyl thioxanthone, 2-chloro thioxanthone, and the like, but are not limited thereto.

Examples of the benzoin compound may include benzoin, benzoin methyl ether, benzoin ethyl ether, benzoin isopropyl ether, benzoin isobutyl ether, or benzyl dimethyl ketal, but are not limited thereto.

Examples of the oxime compound may include 2-(O-benzoyloxime)-1-[4-(phenylthio)phenyl]-1,2-octandione and 1-(O-acetyloxime)-1-[9-ethyl-6-(2-methylbenzoyl)-9H-carbazol-3-yl]ethanone, but are not limited thereto.

The photoinitiator may also be a carbazole compound, a diketone compound, a sulfonium borate compound, a diazo compound, a biimidazole compound, and the like, in addition to the photoinitiator.

The composition may include a solvent. The solvent may be appropriately selected considering affinity for other components in the composition (e.g., a carboxylic acid polymer, a photopolymerizable compound, a photoinitiator, other additives, and the like), affinity for an alkali developing solution, a boiling point, and the like. The composition may include the solvent in a balance amount except for the amounts of desired solids (non-volatile powder).

Non-limiting examples of the solvent may include ethylene glycols such as ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycol ether acetates such as ethylene glycol monomethyl ether acetate, ethylene glycolmonoethyletheracetate, diethylene glycolmonoethyletheracetate, or diethylene glycolmonobutyletheracetate; propylene glycols such as propylene glycol; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, or dipropylene glycoldiethylether; propylene glycoletheracetates such as propylene glycolmonomethyl ether acetate, or dipropylene glycolmonoethyletheracetate; amides such as N-methylpyrrolidone, dimethyl formamide, dimethyl acetamide; ketones such as methylethylketone ("MEK"), methylisobutylketone ("MIBK"), or cyclohexanone; petroleums such as toluene, xylene, or solvent naphtha; esters such as ethyl 3-ethoxy propionate, ethyl acetate, butyl acetate, or ethyl lactate; ethers such as diethyl ether, dipropyl ether, dibutyl ether; or a mixture thereof.

If desired, the photosensitive composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide, or zinc oxide particulates, and metal particles such as gold, silver, copper, or platinum, but is not limited thereto. A particle size of the light diffusing agent may be greater than or equal to about 30 nm, for example, greater than or equal to about 50 nm, greater than or equal to about 100 nm, greater than or equal to about 150 nm, or greater than or equal to about 190 nm and less than or equal to about 1,000 nm, for example, less than or equal to about 500 nm, less than or equal to about 400 nm, or less than or equal to about 300 nm, but is not limited thereto.

The leveling agent may prevent stains or spots and improve planarization and leveling characteristics of a film, and examples thereof may include the following but are not limited thereto.

A fluorine leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adherence with respect to the substrate and examples thereof may include a silane coupling agent. Examples of the silane coupling agent may be vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

Amounts of each component in the composition are not particularly limited and may be adjusted as necessary. For example, the composition may include about 1 weight % (wt %) to about 60 wt % of the quantum dot;

about 0.5 wt % to about 60 wt % of the carboxylic acid polymer;

about 0.5 wt % to about 70 wt % of the photopolymerizable compound;

optionally about 0.1 wt % to about 50 wt % of the multi-thiol compound; and about 0.01 wt % to about 10 wt % of the photoinitiator; and a balance amount of the solvent based on a total weight of the composition, but is not limited thereto.

A content of the quantum dot including the organic ligand may be greater than or equal to about 1 wt %, for example, greater than or equal to about 5 wt %, greater than or equal to about 10 wt %, or greater than or equal to about 12 wt % based on a total weight of the composition. The amount of the quantum may be less than or equal to about 60 wt %, for example, less than or equal to about 50 wt %, less than or equal to about 40 wt %, or less than or equal to about 35 wt % based on a total weight of the composition.

If present, the amount of the light diffusing agent may be greater than or equal to about 1 wt %, for example, greater than or equal to about 5 wt %, greater than or equal to about 8 wt %, or greater than or equal to about 10 wt % based on a total weight of the composition. If present, the amount of the light diffusing agent may be less than or equal to about 50 wt %, for example, less than or equal to about 40 wt %, less than or equal to about 30 wt %, or less than or equal to about 20 wt % based on a total weight of the composition.

In the quantum dot polymer composite, the amount of the quantum dot may be greater than or equal to about 1 wt %, for example, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, or greater than or equal to about 35 wt % based on a total weight of the composite. The amount of the quantum may be less than or equal to about 80 wt %, for example, less than or equal to about 60 wt %, less than or equal to about 55 wt %, less than or equal to about 50 wt %, or less than or equal to about 45 wt based on a total weight of the composition.

If present, the amount of the light diffusing agent may be greater than or equal to about 1 wt %, for example, greater than or equal to about 5 wt %, greater than or equal to about 8 wt %, greater than or equal to about 10 wt %, or greater than or equal to about 20 wt % based on a total weight of the composite. If present, the amount of the light diffusing agent may be less than or equal to about 60 wt %, for example, less than or equal to about 50 wt %, less than or equal to about 45 wt % based on a total weight of the composition. In the quantum dot polymer composite, the amount of the polymer matrix may be greater than or equal to about 10 wt %, for example, greater than or equal to about 20 wt % and less than or equal to about 99 wt %, for example, less than or equal to about 80 wt %, less than or equal to about 70 wt %, or less than or equal to about 80 wt %.

In the composition, a plurality of quantum dots are dispersed (e.g., separated from one another) by the carboxylic acid polymer to form quantum dot dispersion. Accordingly, the composition may include a quantum dot dispersion that may include a plurality of quantum dots dispersed in the carboxylic acid polymer and the carboxylic acid polymer. The quantum dot dispersion may further include a solvent.

A method of producing the composition includes preparing a binder solution including the carboxylic acid polymer and the solvent; dispersing the plurality of quantum dots in the binder solution to obtain quantum dot-binder dispersion; and mixing the quantum dot-binder dispersion with at least one of the multi-thiol compound; the photoinitiator; the photopolymerizable monomer and the solvent. A mixing manner is not particularly limited, and may be appropriately selected. For example, each component may be mixed sequentially or simultaneously.

The method of producing the composition may further include selecting quantum dots including an organic ligand (e.g., having a hydrophobic moiety) on the surface, and selecting a carboxylic acid polymer capable of dispersing the quantum dots. In the selecting the carboxylic acid polymer, a chemical structure and an acid value of a corresponding polymer may be considered. In order to disperse quantum dots, the carboxylic acid polymer may have an acid value that may be different depending on a chemical structure (e.g., chemical structures of a binder backbone or a hydrophobic moiety at a side chain) of the polymer For example, the carboxylic acid polymer may have an acid value of greater than or equal to about 50 mg KOH/g, for example, greater than or equal to about 60 mg KOH/g or greater than or equal to about 120 mg KOH/g. The carboxylic acid polymer may have for example an acid value of less than or equal to about 250 mg KOH/g, or less than or equal to about 200 mg KOH/g, but is not limited thereto. The quantum dots may be mixed in a solution including the binder to form a quantum dot-binder dispersion and the formed quantum dot-binder dispersion may exhibit enhanced compatibility with other components for the photoresist (e.g., the photopolymerizable compound, a photoinitiator, a solvent, and the like). As a result, the quantum dot may be dispersed in the final composition (the photoresist composition) to such an extent that they form a pattern.

The composition may be coated on a transparent substrate by an appropriate manner (e.g., spin coating) to form a film. The formed film may be subjected to pre-baking as needed. The pre-baking may be performed at a temperature of less than or equal to about 130° C., for example, about 90° C. to about 120° C. A time of the pre-baking is not particularly limited and may be appropriately selected. For example, the pre-baking may be performed for greater than or equal to about 1 minute or greater than or equal to about 10 minutes and less than or equal to about 60 minutes, but is not limited thereto. The pre-baking may be performed under a predetermined atmosphere (e.g., air, oxygen-free atmosphere, inert gas atmosphere), is not particularly limited thereto.

In the exposed region, cross-linking polymerization may occur to form a quantum dot polymer composite having the plurality of the quantum dots dispersed in the polymer matrix. The resulting film may be treated with an alkali aqueous solution to remove the unexposed region from the film and to obtain a pattern of the quantum dot polymer composite. The photosensitive composition may be developable by an alkali aqueous solution, and when the photosensitive composition is used, a pattern of the quantum dot-polymer composite may be formed without using an organic solvent developing solution.

Figure 4:
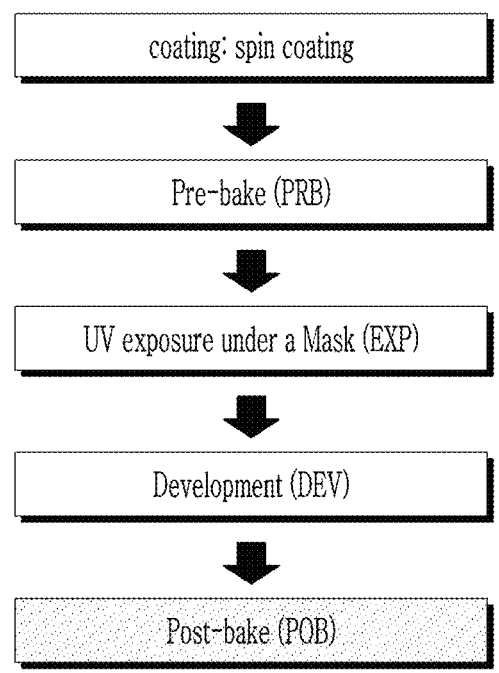
FIG. 4 is a view showing an embodiment of a process of forming a luminescent layer including a quantum dot-polymer composite pattern on a substrate in a layered structure of an embodiment.
Figure 4:

A non-limiting method of forming a pattern is explained referring to FIG. 4. The composition may be coated on a predetermined substrate (e.g., a glass substrate or a glass substrate coated with a predetermined thickness of SiNx (protective layer) (e.g., about 500 Å to about 1500 Å of the protective layer)) in an appropriate manner such as spin coating or slit coating to form a film (i.e., the photoluminescent layer) of a predetermined thickness (e.g., a thickness of greater than or equal to about 3 µm or greater than or equal to about 5 µm and less than or equal to about 30 µm for example, less than or equal to about 20 µm or less than or equal to about 10 µm). The formed film may be pre-baked, if desired. The formed (or optionally pre-baked) film may be exposed to light having a predetermined wavelength under a mask having a predetermined pattern. A wavelength and intensity of the light may be selected considering kinds and contents of the photoinitiator, kinds and contents of the quantum dots, and the like.

The exposed selected area of the film may be treated (e.g., dipped or sprayed) with an alkali developing solution and thereby an unexposed region of the film may dissolve out to form the quantum dot polymer composite pattern. The formed quantum dot polymer composite pattern may be heat-treated at a temperature of greater than or equal to (the organic solvent's boiling point—10° C.) (e.g., greater than or equal to about a boiling point of the organic solvent) and less than about 160° C. (e.g., when the organic solvent is propylene glycol methyl ether acetate ("PGMEA"), the temperature may be in a range of about 145° C. to about 152° C.). The formed quantum dot polymer composite pattern may be heat-treated at a temperature of greater than or equal to about 160° C. (e.g., about 180° C. to about 200° C.). By the heat-treatment, the solvent included in the composition (and the unreacted monomer) can be removed from the pattern.

An organic layer is formed on a surface of the heat-treated quantum dot polymer composite pattern. Formation of the organic layer may include applying (e.g., coating) a liquid composition including a compound represented by Chemical Formula 2 on the heat-treated quantum dot-polymer composite pattern and conducting a polymerization reaction between, e.g., with, the compound:

Chemical Formula 2

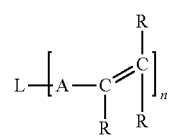

wherein L is a substituted or unsubstituted aliphatic hydrocarbon, a substituted or unsubstituted aliphatic hydrocarbon wherein at least one methylene group is replaced with an ester group, an ether group, a carbonyl group, an amide group, or a combination thereof, a substituted or unsubstituted alkylene oxide moiety, a substituted or unsubstituted polyalkylene oxide moiety, a substituted or unsubstituted heterocyclic moiety, a substituted or unsubstituted alicylic moiety, a substituted or unsubstituted aromatic hydrocarbon group, an organic siloxane moiety, or a combination thereof, as described for Chemical Formula 1, A is the same or different and each is independently a single bond, a C1 to C10 alkylene group, an ether group, a carbonyl group, an ester group, —NH—, an amide group, or a combination thereof, R is the same or different and each is independently hydrogen or a C1 to C10 alkyl group, and n is an integer of greater than or equal to 1 and less than or equal to 6.

The compound represented by Chemical Formula 2 may include an oligomer having a weight average molecular weight of greater than or equal to about 100 g/mol, greater than or equal to about 15 g/mol 0, or greater than or equal to about 200 g/mol and less than or equal to about 5,000 g/mol, for example, less than or equal to about 4,000 g/mol, less than or equal to about 3,000 g/mol, less than or equal to about 2,000 g/mol, less than or equal to about 1,500 g/mol, or less than or equal to about 1,000 g/mol.

The compound represented by Chemical Formula 2 is commercially available or may be synthesized by an appropriate method.

The compound represented by Chemical Formula 2 may include a compound represented by Chemical Formula 2-1, a compound represented by Chemical Formula 2-2, or a combination thereof:

Chemical Formula 2-1

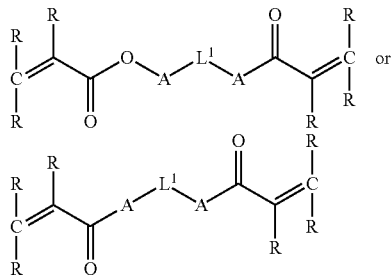

wherein $L^1$ is a C1 to C40 alkylene, a C1 to C40 alkenylene, —($R^1$O)n- (where R is a C1 to C10 alkylene, n is an integer from 1 to 20), —($R^2$O)n-($CR^3{}_2$)—($R^4$O)m- (where $R^2$ and $R^4$ are the same or different and each independently a C1 to C10 alkylene, $R^3$ are the same or different and each is independently hydrogen or a C1 to C10 alkyl group, and n is an integer from 1 to 20), or a combination thereof, R is the same or different and each is independently hydrogen or a C1 to C10 alkyl group, A is a single bond, —O—, or —NH—; and Chemical Formula 2-2

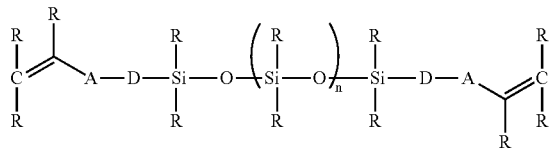

A is the same or different and each is independently a single bond, a C1 to C10 alkylene group, an ether group, a carbonyl group, an ester group, or a combination thereof, R is the same or different and each is independently hydrogen or a C1 to C10 alkyl group, D is the same or different and each is independently a single bond, a C1 to C10 alkylene group or a C2 to C10 alkylene group substituted with a hydroxyl group wherein at least one methylene may be replaced with an ether group, and n is greater than or equal to about 0 and less than or equal to about 100. For example, n is greater than 0, for example, greater than or equal to about 1, greater than or equal to about 2, or greater than or equal to about 3, and less than or equal to about 100, less than or equal to about 90, less than or equal to about 80, less than or equal to about 70, less than or equal to about 40, less than or equal to about 30, or less than or equal to about 20.

Examples of the compound represented by Chemical Formula 2 may include tert butylcyclohexyl(meth)acrylate, dicyclopentadienyl (meth)acrylate, dicyclopentyloxyethyl (meth)acrylate, 2-(butylcarbamoyloxyethyl) (meth)acrylate, phenoxyethyl(meth)acrylate, ethoxylated phenoxyl(meth) acrylate, 3,3,5-trimethylcyclohexane(meth)acrylate, 2(2-ethoxyethoxy)ethyl(meth)acrylate, cyclictrimethylol propane (meth)acrylate, tetrahydroperfuryl (meth)acrylate, lauryl(meth)acrylate, isodecyl(meth)acrylate, isodecyl (meth)acrylate, 2-phenoxyethyl(meth)acrylate, stearyl (meth)acrylate, glycidyl(meth)acrylate, isobornyl(meth) acrylate, benzyl(meth)acrylate, hydroxyl pivaloyl hydroxy pivalate di(meth)acrylate, 1,9-nonanedioldi(meth)acrylate, tricyclodecanedimethanoldi(meth)acrylate, 1,6-hexanedioldi(meth)acrylate, ethoxylated 1,6-hexanedioldi(meth) acrylate, dipropyleneglycoldi(meth)acrylate, polyethyleneglycoldi(meth)acrylate [$CH_2$=CH ROCO ($CH_2CH_2O)_n$COCHR=$CH_2$, R is hydrogen or a methyl group, n is 1 to 15], 1,4-butanedioldi(meth)acrylate, neopentylglycoldi(meth)acrylate, propoxylated neopentylglycoldi(meth)acrylate, 2-methyl-1,3-propanedioldi(meth) acrylate, ethoxylated 2-methyl-1,3-propanedioldi(meth) acrylate, 2-butyl-2-ethyl-1,3-propanedioldi(meth)acrylate, trimethylolpropanetri(meth)acrylate, ethoxylated trimethylol propanetri(meth)acrylate, and a combination thereof, but are not limited thereto.

Examples of the compound represented by Chemical Formula 2 may include bis(methacryloyloxy alkyl) terminated PDMS (e.g., bis(methacryloyloxypropyl)terminated PDMS), bis(acryloyloxy alkyl) terminated PDMS (e.g., bis (acryloyloxy propyl) terminated PDMS), bis(acryloyloxy hydroxyl alkoxyalkyl)terminated PDMS (e.g., bis(acryloyloxy hydroxylpropoxypropyl)terminated PDMS, or an organic PDMS represented by the following Chemical Formulae, but are not limited thereto:

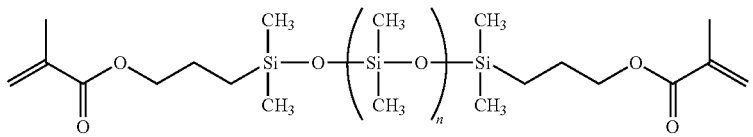

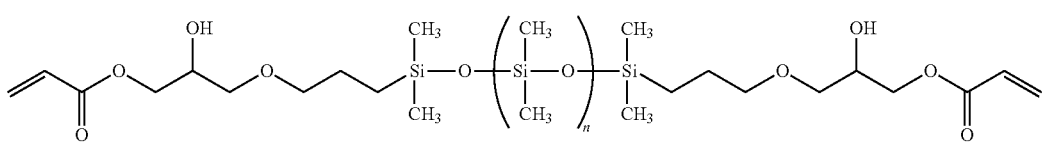

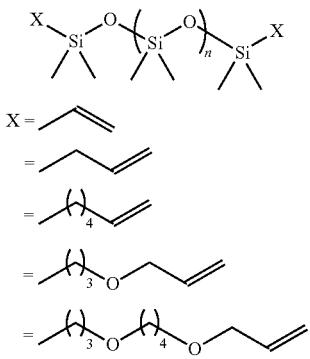

In the above formulae, n is greater than 0, for example, greater than or equal to about 1, greater than or equal to about 2, or greater than or equal to about 3, and less than or equal to about 100, less than or equal to about 90, less than or equal to about 80, less than or equal to about 70, less than or equal to about 40, less than or equal to about 30, or less than or equal to about 20.

In the liquid composition, the compound represented by Chemical Formula 2 may be present alone or as a mixture of at least two different compounds.

The liquid composition may have a shear viscosity of less than or equal to about 30 cps. With such a shear viscosity, the liquid composition may effectively control the surface defects of the photoluminescent layer. The lower limit of the shear viscosity of the liquid composition is not particularly limited and may be selected appropriately considering the easiness of the handling, a coating method, a thickness of the organic layer to be formed.

The liquid composition may have a surface tension of less than or equal to about 40 dyne/cm. With such a surface tension, the liquid composition may effectively control the surface defects of the photoluminescent layer. The lower limit of the surface tension of the liquid composition is not particularly limited and may be selected appropriately considering the easiness of the handling, a coating method, a thickness of the organic layer to be formed.

The liquid composition may further include an organic solvent. The types and the amounts of the organic solvent may be selected in such a manner that the properties (e.g., luminous properties) of the composite of the photoluminescent layer are not adversely affected. The liquid composition may essentially consist of the compound of Chemical Formula 2. In addition to the compound of Chemical Formula 2, the liquid composition may further include the organic solvent and/or other additives. When the liquid composition includes the organic solvent, the concentration of the compound represented by Chemical Formula 2 may be selected appropriately in order to obtain the shear viscosity and/or the foregoing surface tension within the foregoing ranges and is not particularly limited.

Details of the inorganic material and the inorganic layer are the same as set forth above. The formation of the inorganic layer may be carried out by physical vapor deposition, chemical vapor deposition, or a combination thereof. Specific conditions for the forming process of the inorganic layer may be different depending on the types of the inorganic material.

The physical vapor deposition may be performed by a thermal vacuum method, a sputtering method, and/or an electron beam method. The physical vapor deposition may be performed by a commercially available apparatus and a known method considering the types of an inorganic material and a structure/thickness of the inorganic layer. An atmosphere, a temperature, a target material, and a vacuum degree of the deposition may be appropriately selected and are not particularly limited. A manner of the chemical vapor deposition is not particularly limited and may be appropriately selected. The chemical vapor deposition may be performed by manners of normal pressure CVD, low pressure CVD, ultra high vacuum CVD, plasma CVD, and the like, but is not limited thereto. The chemical vapor deposition may be performed by a commercially available apparatus and a known method considering the types of an inorganic material and a structure/thickness of the inorganic layer. An atmosphere, a temperature, types of a gas, and a vacuum degree of the deposition may be appropriately selected and is not particularly limited.

The inorganic layer may be formed over the quantum dot polymer composite pattern mainly in order to protect and shield the quantum dot from moisture and oxygen. In some embodiments, the formation of the inorganic layer includes a vapor deposition using a thin film process equipment. When a physical vapor deposition (hereinafter, referred to as PVD) equipment is used, the inorganic layer may be formed at room temperature. In some embodiments, alternating deposition of different materials may be conducted in order to realize smaller reflectance and minimize the occurrence of defects. During the alternating deposition, the thickness of each layer may be dependent on an optical design value, and the optimized thickness may be determined considering the minimization of the reflectance. The optical design value indicates, for example, a combination of optical thicknesses. The thickness for the minimized reflectance may be obtained through an optical simulation by using a commercially available program, for example, Essential Macleod and the like. In the case of the multilayered inorganic layer, a total number of the layers may be greater than or equal to about two (2), for example, greater than or equal to about three (3). In some embodiments, a total number of the layers may be less than or equal to about 50, less than or equal to about 40, less than or equal to about 30, or less than or equal to about 20. In the case of using a chemical vapor deposition ("CVD") equipment, the deposition may be performed at a temperature of about 120° C. to about 200° C. The deposition manner, e.g., conditions, may be substantially the same as or similar to those for the PVD. For example, the CVD may form a SiN, SiO$_2$, and/or SiON layer. In the case of the CVD, the deposition rate may be greater than the other sputtering and the formed film may be denser. The temperature of the sputtering may be less than or equal to about 180°

C., the sputtering gas may be a combination of $SiH_4+N_2$ or a combination of $SiH_4+N_2+O_2$, but it is not limited thereto.

After the formation (or deposition) of the inorganic layer, the layered structure may be heat-treated at a temperature of greater than or equal to about 160° C. and less than or equal to about 250° C. or for example less than or equal to about 240° C. (e.g., a temperature of about 160° C. to about 230° C.) (hereinafter, referred to as a post-baking process or a POB process). The post-baking process may improve resistance against crack and against a solvent of the quantum dot polymer composite pattern. Duration for the post-baking may be selected appropriately without particular limitation. For example, the post-baking process may be carried out for a time greater than or equal to about 5 minutes, for example, greater than or equal to about 10 minutes or greater than or equal to about 20 minutes but is not limited thereto. For example, the post-baking process may be performed for less than or equal to about 60 minutes, for example, less than or equal to about 40 minutes or less than or equal to about 35 minutes but is not limited thereto.

In some embodiments, the layered structure may exhibit improved stability such that it may maintain its photoconversion efficiency at a level of greater than or equal to about 90% of the initial photoconversion efficiency, even after the post-baking process. Accordingly, the layered structure of some embodiments may either show substantially no decrease in the photoconversion efficiency or exhibit an increased photoconversion efficiency under a predetermined environment (e.g., when it is irradiated with excitation light at a temperature of about 65° C. and under a relative humidity of about 85%).

When the layered structure is used as a color filter, two or three types of photosensitive compositions including red light emitting quantum dots, green light emitting quantum dots, (or optionally, blue light emitting quantum dots) may be prepared, and the patterning process may be repeated necessary times (e.g., at least twice or three times) for each composition.

In an embodiment, an electronic device includes the layered structure. The electronic device may be a photoluminescent liquid crystal display. The liquid crystal display may include a liquid crystal panel including a lower substrate, an upper substrate, a liquid crystal layer disposed between the upper and lower substrates, and a photoluminescent color filter layer provided on the upper substrate; a polarizer disposed under the lower substrate; and a backlight unit disposed under the polarizer and emitting blue light, wherein the photoluminescent color filter layer includes the layered structure.

Figure 5:
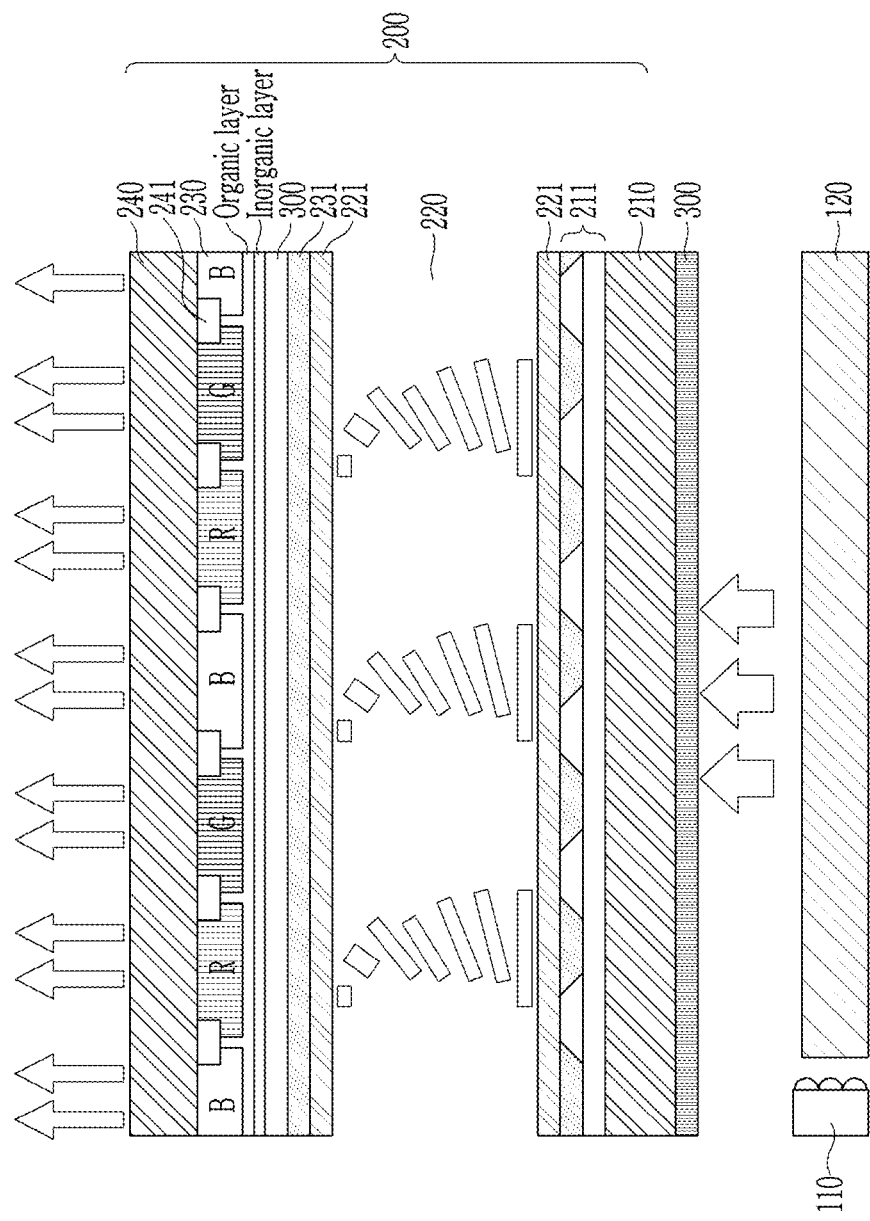
FIG. 5 is a cross-sectional view showing an embodiment of a liquid crystal display.

FIG. 5 is a cross-sectional view showing a liquid crystal display according to an embodiment. Referring to FIG. 5, a photoluminescent liquid crystal display device includes a liquid crystal panel 200, a lower polarizer 300 disposed under the liquid crystal panel 200, and a backlight unit ("BLU") disposed under the lower polarizer 300. The backlight unit includes (e.g., blue) light source 110. The backlight unit may further include a light guide panel 120. The backlight unit may not include a light guide panel.

The liquid crystal panel 200 includes a lower substrate 210, an upper substrate 240, a liquid crystal layer 220 disposed between the upper and lower substrates, and a photoluminescent color filter layer provided on the upper substrate. The photoluminescent color filter layer includes a luminescent layer including a pattern of a quantum dot polymer composite; and an inorganic layer disposed on the photoluminescent layer and including an inorganic material.

The lower substrate 210, also referred to as an array substrate, may be a transparent insulation material substrate (e.g., a glass substrate, a polymer substrate including a polyester such as polyethylene terephthalate ("PET") or polyethylene naphthalate ("PEN"), polycarbonate, polyimide, polyamide, poly(imide-amide), and/or a poly(meth) acrylate, inorganic material substrate of a polysiloxane, $Al_2O_3$, or ZnO. A wire plate 211 may be disposed on the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 may be provided under the lower substrate. Materials and structures of the lower polarizer 300 are known and are not particularly limited. A backlight unit (e.g., emitting blue light) may be disposed under the lower polarizer 300. An upper optical element such as an upper polarizer 300 may be disposed on the upper substrate, for example, provided between the liquid crystal layer 220 and the upper substrate 240, in particular, between the liquid crystal layer 220 and the photoluminescence color filter, but is not limited thereto. The polarizer may be any polarizer that used in a liquid crystal display device. The polarizer may be triacetyl cellulose ("TAC") having a thickness of less than or equal to about 200 µm, but is not limited thereto. In an alternative embodiment, the upper optical element may be a coating that controls a refractive index without a polarization function.

The backlight unit includes a light source emitting blue light. In an embodiment, the backlight unit may be an edge-type lighting. For example, the backlight unit may include a reflector (not shown), a light guide (not shown) provided on the reflector and providing a planar light source with the liquid crystal panel 200, and/or at least one optical sheet (not shown) on the light guide, for example, a diffusion plate, a prism sheet, and the like, but is not limited thereto.

In an embodiment, the backlight unit may be a direct lighting. For example, the backlight unit may have a reflector (not shown), and may have a plurality of fluorescent lamps disposed on the reflector at regular intervals, or may have a light-emitting diode ("LED") operating substrate on which a plurality of LEDs may be disposed, a diffusion plate thereon, and optionally at least one optical sheet.

Details (e.g., each components of light guide and various optical sheets, a reflector, and the like) of such a backlight unit are known and are not particularly limited.

The upper substrate 210 may be the transparent substrate. A black matrix 241 may be provided under the upper substrate and may have an opening and hides the gate line, the data line, and the thin film transistor of the wire plate on the lower substrate. For example, the black matrix 241 may have a lattice shape. In openings of the black matrix 241, a luminescent layer 230 including a first section (R) configured to emit light (e.g., red light) in a first peak wavelength, a second section (G) configured to emit light (e.g., green light) in a second peak wavelength, and a third section (B) configured to emit or transmit for example blue light may be provided. If desired, the photoluminescent color filter layer may further include a fourth section. The fourth section may include a quantum dot emitting a light of different colors (e.g., cyan, magenta, and yellow) from the light emitted from the first to third sections.

In the photoluminescent layer 230, sections forming a pattern may be repeated corresponding to pixel areas formed on the lower substrate. A transparent common electrode 231 may be provided on the photoluminescent color filter layer.

The third section (B) configured to emit or transmit blue light may be a transparent color filter that does not change a light emitting spectrum of the light source. In this case, blue light emitted from the backlight unit may pass the polarizer and the liquid crystal layer to become a polarized state, then enter the third section (B) in a polarized state, and may be go out of the third section (B) as it is. If needed, the third section may include quantum dots emitting blue light.

If desired, the photoluminescent liquid crystal display device may further have a blue light blocking layer (blue cut filter). The blue light blocking layer (e.g., the blue cut filter) may be disposed between lower surfaces of the first section (R) and the second section (G) and the upper substrate 240 or on the upper substrate (not shown). The blue light blocking layer may include a sheet having an opening in a region corresponding to a pixel area displaying blue (a third section emitting blue light) and formed in a region corresponding to first and second sections. In an embodiment, the blue light blocking layer may be formed by alternately stacking at least two layers having different refractive indexes and thus may block light in a blue wavelength region but transmit light in the other wavelength regions. The blocked blue wavelength light may be reflected and recycled. The blue light blocking layer may play a role of blocking light emitted from a blue light source 510 from being directly emitted outside.

Hereinafter, the embodiments are illustrated in more detail with reference to examples. However, they are exemplary embodiments, and the embodiments are not limited thereto.

EXAMPLES

Measurement Method:

[1] A Photoconversion Efficiency and a Maintenance Percentage are Obtained in the Following Method:

(1) A blue light photoconversion efficiency of a quantum dot polymer composite film is obtained by the following procedures. The prepared quantum dot polymer composite is inserted between a light guide and an optical sheet of a 60 inch television ("TV") equipped with blue LED having a peak wavelength of 449 nm. The TV is operated and light emitting properties are analyzed with a spectroradiometer (CS-2000, Konica Minolta Co.) 45 cm away therefrom and a spectrum of light emitted therefrom is obtained. The light emitting spectrum is used to calculate the photoconversion efficiency.

(2) A maintenance percentage is a percentage of a photoconversion efficiency after the process relative to a photoconversion efficiency before the process.

[2] Scanning Electron Microscopy Analysis

A scanning electron microscopic analysis is made using Hitachi S5500.

Reference Example 1: Preparation of (Green Light-Emitting or Red Light-Emitting) Non-Cadmium Quantum Dot (1) 0.2 mmol of indium acetate, optionally 0.1 mmol of zinc oleate, 0.6 mmol of palmitic acid, and 10 milliliters (mL) of 1-octadecene are put in a reactor and heated at 120° C. under vacuum. After 1 hour, an atmosphere in the reactor is replaced with nitrogen. The reactor is heated at 280° C., a mixed solution of tris(trimethylsilyl)phosphine ("TMS3P", 0.1 mmol) and trioctylphosphine (0.5 mL) is rapidly injected thereinto, and the mixture is reacted for 20 minutes. Subsequently, acetone is added to the reaction solution rapidly cooled down to room temperature, and a precipitate obtained by centrifuging the mixture is dispersed in toluene to obtain the InP or InZnP core nanocrystals.

0.3 mmol (0.056 g) of zinc acetate, 0.6 mmol (0.189 g) of oleic acid, and 10 mL of trioctylamine are put in a reaction flask and vacuum-treated at 120° C. for 10 minutes. The reaction flask is heated up to 220° C. after substituting inside of the reaction flask with $N_2$. After the toluene dispersion of the InP semiconductor nanocrystal (OD: 0.15) and 0.6 mmol of S/TOP (sulfur dissolved or dispersed in trioctyl phosphine) are added to the reaction flask, the obtained mixture is heated up to 280° C. and reacted for 30 minutes. When the reaction is complete, the reaction solution is rapidly cooled down to room temperature to obtain a reactant including the (red-light emitting) InP/ZnS or (green light emitting) InZnP/ZnS semiconductor nanocrystal.

(2) An excess amount of ethanol is added to the reactant including the InP/ZnS semiconductor nanocrystal, and the mixture is centrifuged. After the centrifuging, a supernatant is removed, and a precipitate therein is dried and dispersed in chloroform or toluene to obtain a quantum dot solution (hereinafter, a QD solution). An ultraviolet-visible (UV-vis) absorption spectrum of the QD solution is measured. The quantum dot had a quantum efficiency of greater than or equal to 50% (50% to 100%).

Example 1

[1] Preparation of Quantum Dot-Binder Dispersion

A chloroform dispersion of the quantum dots (InP/ZnS core-shell, green light emitting) including oleic acid as a hydrophobic organic ligand on a surface thereof synthesized in Reference Example 1 is prepared. The chloroform dispersion including 50 grams (g) of the quantum dots is mixed with 100 g of a binder (a four-membered copolymer of methacrylic acid, benzyl methacrylate, hydroxyethylmethacrylate, and styrene (mole ratio=61.5%:12%:16.3%:10.2%), an acid value: 130 mg KOH/g, a number average molecular weight: 8,000 g/mol) solution (solvent: polypropylene glycol monomethyl ether acetate having a concentration of 30 wt %) to prepare a quantum dot-binder dispersion. It is confirmed that the quantum dots are uniformly dispersed in the prepared quantum dot-binder dispersion.

[2] Preparation of Photosensitive Composition

To the quantum dot-binder dispersion prepared in [1], 100 g of hexaacrylate having the following structure as a photopolymerizable monomer, an oximeester compound as an initiator, 30 g of $TiO_2$ as a light diffusing agent (an average particle size: 200 nm), and 300 g of propylene glycol methyl ether acetate ("PGMEA") as a solvent is added to obtain a photosensitive composition.

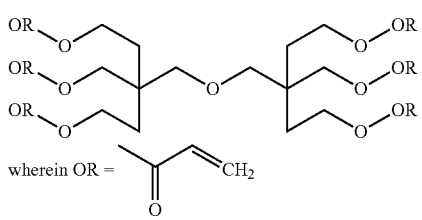

wherein OR = [acrylate group structure]

It is confirmed that the prepared composition may form dispersion without showing any noticeable agglomeration due to the addition of the quantum dots.

[3] Formation of Quantum Dot-Polymer Composite Pattern

The photosensitive composition obtained from [2] is spin-coated on a glass substrate at 150 rpm for 5 seconds to provide a film. The obtained film is pre-baked ("PRB") at 100° C. A blue photoconversion efficiency of the pre-baked film is measured, and the results are compiled in Table 1. The pre-baked film is radiated by light (a wavelength: 365 nm, intensity: 100 millijoule (mJ)) for 1 second under a mask having a predetermined pattern (e.g., a square dot or stripe pattern) and developed by a potassium hydroxide aqueous solution (a concentration: 0.043%) for 50 seconds to provide a quantum dot-polymer composite pattern. For the obtained quantum dot polymer composite, a photoconversion efficiency is measured and the measured value is set as a reference value (100%).

The obtained pattern is heat-treated at a temperature of about 180° C. for 30 minutes under a nitrogen or air atmosphere in order to remove a remaining solvent or an unreacted monomer. After the heat-treatment, the photoconversion efficiency of the quantum dot polymer composite is measured and the maintenance percentage with respect to the reference value is calculated and compiled in Table 1 and FIG. 8.

[3] Organic Layer Formation

A composition for forming an organic layer is prepared to include a diacrylate compound having an acrylate at each of its ends and the normal alkyl chain as a backbone (weight average molecular weight: 200 g/mol, 300 g/mol) or a polydimethyl siloxane having an acrylate at each of its ends (weight average molecular weight: 200 g/mol, 300 g/mol, 1,000 g/mol or lower) optionally together with an organic solvent. The surface tension of the composition is about 30 dyne/cm at 25° C. and its shear viscosity is about 20 cps at 25° C.

The composition for forming an organic layer is spin-coated on the pattern at 1,000 rpm for 10 seconds and the resulting film is irradiated with light (wavelength: 365 nm, intensity: 100 mJ) for one second to form an organic layer.

[4] Formation of Inorganic Layer

Figure 8:
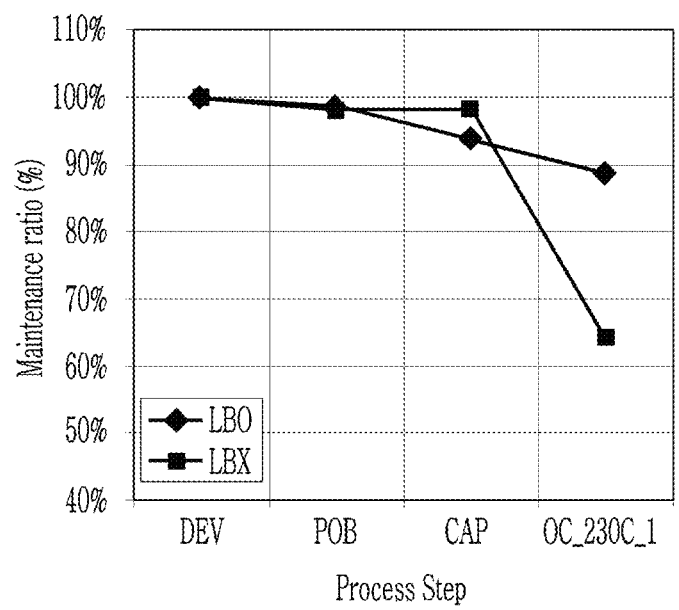
FIG. 8 is a graph showing changes in the maintenance percentage of photoconversion efficiency during a production process of the layered structure of Example 1 and Comparative Example 1.

On the organic layer, an inorganic layer (a thickness: 400 nm) including titanium dioxide is formed through sputtering (sputtering temperature: room temperature, sputtering gas: argon+oxygen, target: titanium metal, purity: 99.999%), then, its photoconversion efficiency is measured, and the maintenance percentage with respect to the reference value is calculated and compiled in Table 1 and FIG. 8.

[5] Planarization and High Temperature Heat-Treatment

Figure 6:
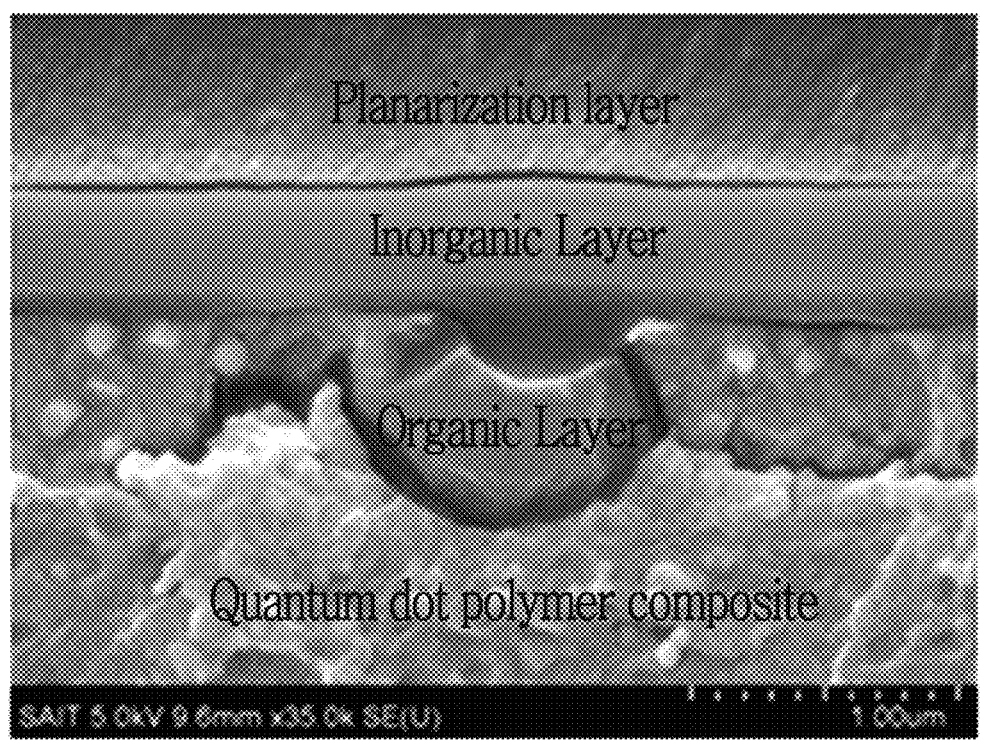
FIG. 6 is an electron microscopic image of a cross-section of a layered structure prepared in Example 1.

A polymer solution including a urethane acrylate is spin-coated on the layered structure with the formed inorganic layer to form an overcoat (OC, a planarization layer). A scanning electron microscopic analysis is made for the cross-section of the obtained layered structure and the results are shown in FIG. 6. The results of FIG. 6 confirm that in the layered structure thus obtained, the defects present on the quantum dot polymer composite pattern is not transferred to the inorganic layer due to the presence of the organic layer and thereby the formation of the inorganic layer having no defect may be achieved.

The final layered structure is subjected to a heat treatment at 230° C. for 30 minutes and then, its photoconversion efficiency is measured, and the maintenance percentage with respect to the reference value is calculated and compiled in Table 1 and FIG. 8.

Comparative Example 1

Figure 7:
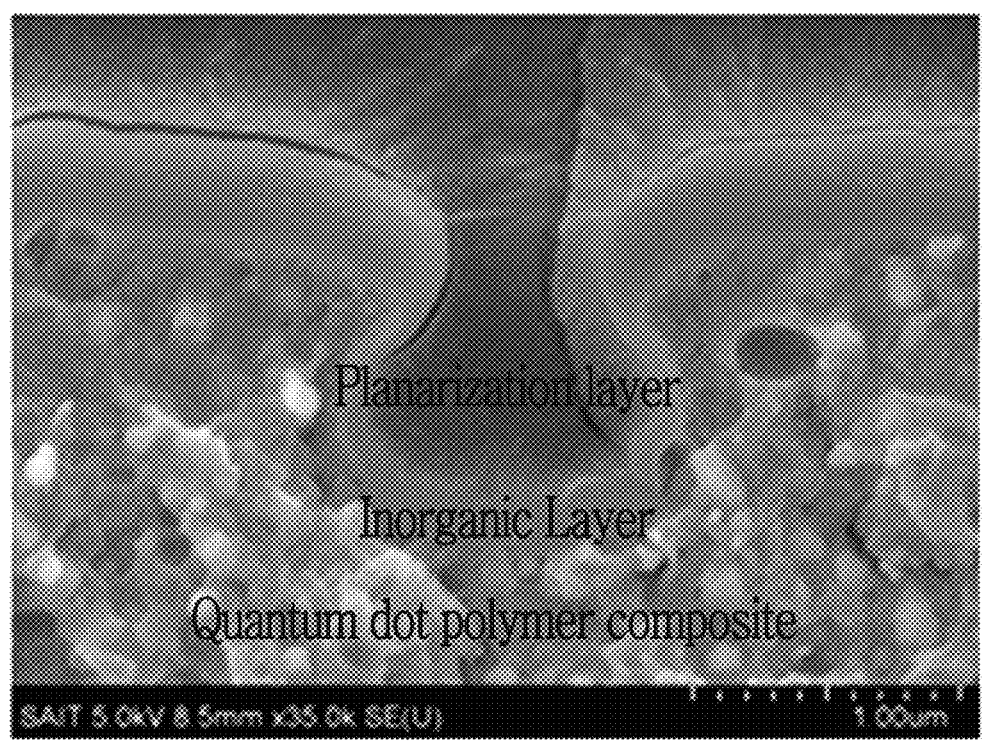
FIG. 7 is an electron microscopic image of a cross-section of a layered structure prepared Comparative Example 1.

The quantum dot polymer composite pattern manufactured in the same method as Example 1 without forming the organic layer. A polymer solution including a urethane acrylate is spin-coated on the layered structure with the formed inorganic layer to form an overcoat (OC, a planarization layer). A scanning electron microscopic analysis is made for the cross-section of the obtained layered structure and the results are shown in FIG. 7. The results of FIG. 7 confirm that in the layered structure thus obtained, the defects (void and bumps) present on the quantum dot polymer composite pattern is transferred to the inorganic layer and the subsequent overcoat and thus the inorganic layer and the planarization layer include noticeable defects.

The photoconversion efficiency is measured at each of the same steps as in Example 1, and the maintenance ratios with respect to the reference value are calculated and compiled in Table 1 and FIG. 8.

TABLE 1

| Step | Example 1 ("LBO") | Comp. Example 1 ("LBX") |
|---|---|---|
| Developing (DEV) | 100% | 100% |
| Heat treatment at 180° C. | 98% | 98% |
| Formation of the inorganic layer | 94% | 98% |
| Heat treatment at 230° C. | 89% | 63% |

The results of Table 1 and FIG. 8 indicate that at the formation of the inorganic layer, the layered structure of Example 1 show a slightly decreased maintenance percentage in comparison with the layered structure of Comparative Example 1, but after the heat-treatment of about 230° C., the layered structure of Example 1 has a maintenance percentage significantly higher than that of layered structure of Comparative Example 1.

Example 2

A layered structure having the inorganic layer is obtained in the same manner of Example 1. For the recycling of light, twelve layers of $SiO_2$ and $TiO_2$ (a total thickness: about 1 μm, Yellow Reflective Filter (YRF)) are alternately vapor deposited via sputtering on the inorganic layer (temperature: room temperature, sputtering gas: argon+oxygen, target: $SiO_2$ and $TiO_2$, purity: 99.999%).

Figure 9:
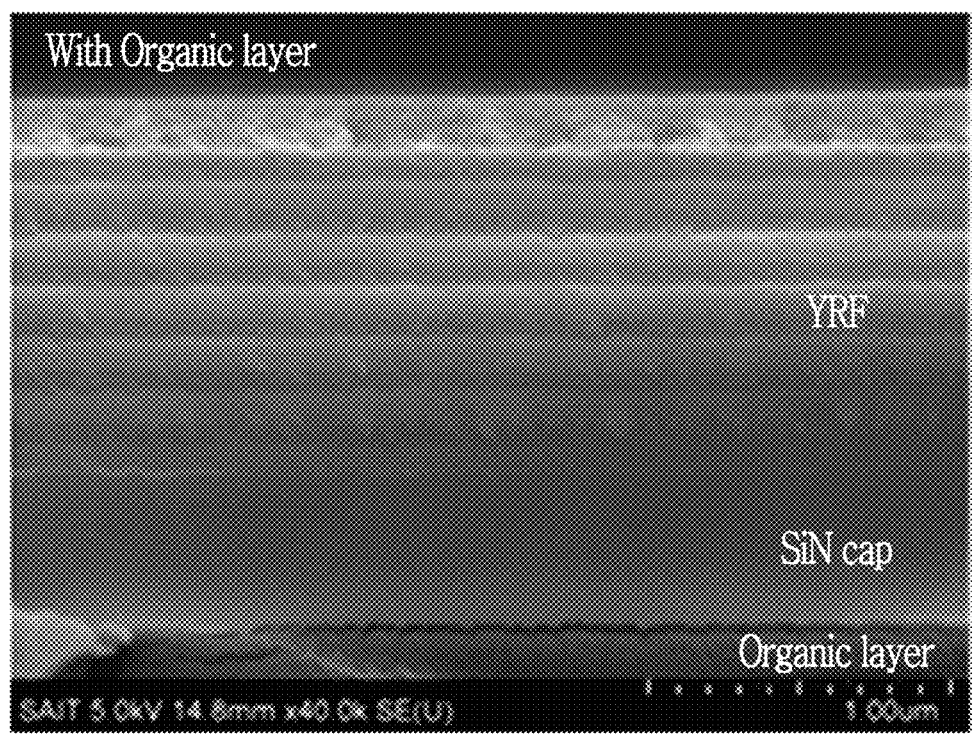
FIG. 9 is an electron microscopic image of a cross-section of a layered structure prepared in Example 2.

The cross-section of the layered structure thus prepared is observed using a scanning electron microscope and the results are shown in FIG. 9.

The results of FIG. 9 indicate that a multi-layered inorganic film is formed over the photoluminescent layer after the organic layer is formed on the photoluminescent layer, the multi-layered inorganic film does not have defects that correspond to the defects present on the photoluminescent layer and thereby no cracks occur on the cross-section of the layered structure does not include.

In the layered structure of the Example, each layer of the inorganic film is uniform and planarized and thus the resulting layered structure may have improved luminous properties and is expected to demonstrate the recycling of light as designed.

Comparative Example 2

A layered structure having the inorganic layer is obtained in the same manner of Comparative Example 1. For the recycling of light, the YRF layer is formed on the inorganic layer in the same manner as set forth in Example 2.

Figure 10:
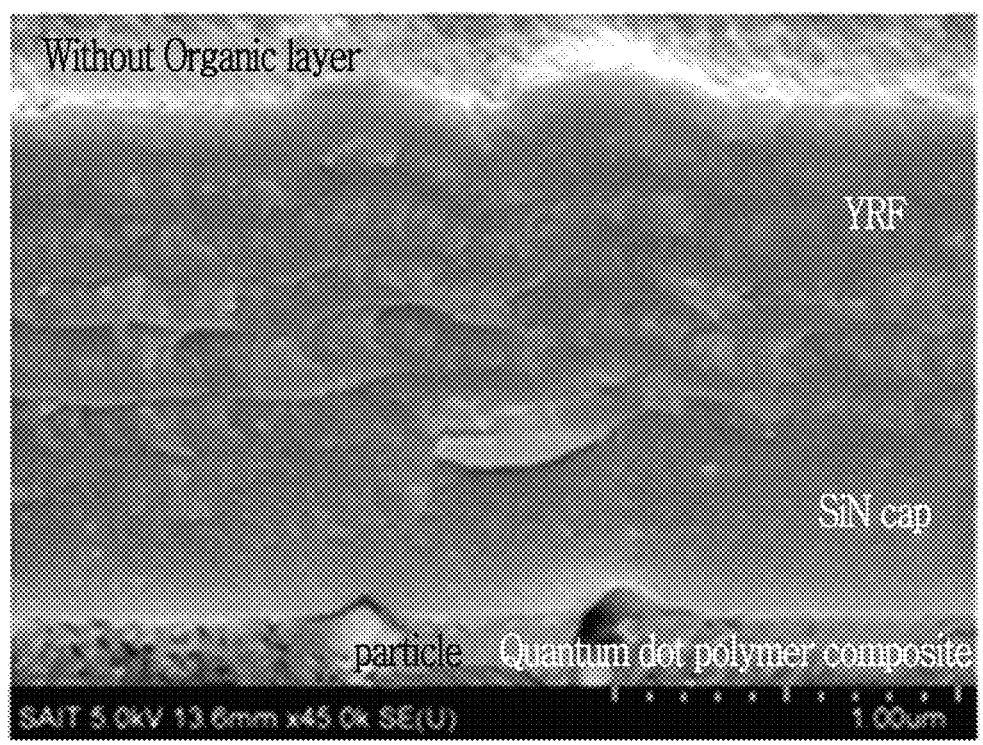
FIG. 10 is an electron microscopic image of a cross-section of a layered structure prepared Comparative Example 2.

The cross-section of the layered structure thus prepared is observed using a scanning electron microscope and the results are shown in FIG. 10.

The results of FIG. 10 indicate that a multi-layered inorganic film is formed on the photoluminescent layer without the organic layer, defects are transferred to each of the inorganic layers corresponding with the defects present on the surface of the photoluminescent layer, and thereby a noticeable crack is formed on the cross-section of the layered structure. As the layered structure of the Comparative Example includes defects on each of the inorganic layers, the quantum dot polymer composite tends to expose to external environment and thus it becomes difficult to maintain the luminous properties thereof. In addition, it is expected that the inorganic layer cannot demonstrate the recycling of light as designed due to such defects.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A layered structure comprising:
a luminescent layer comprising a quantum dot polymer composite pattern;
an inorganic layer with a thickness of about 600 nanometers to 10 micrometers disposed on the luminescent layer, the inorganic layer comprising alternate layers of a first inorganic material and a second inorganic material directly in contact with the alternating first inorganic material;
an organic layer directly disposed on the luminescent layer and having a thickness of less than or equal to about 40 nm, the organic layer comprising an organic polymer, wherein the inorganic layer is directly disposed on the organic layer; and
a transparent substrate disposed on a surface of the luminescent layer opposite the inorganic layer;
wherein the quantum dot polymer composite pattern comprises a repeating section comprising a polymer matrix and a plurality of quantum dots in the polymer matrix, and the repeating section comprises a first section configured to emit a first light, wherein the inorganic material is disposed on at least a portion of a surface of the repeating section,
wherein the quantum dot polymer composite pattern of the luminescent layer absorbs light passing through the inorganic layer, and
wherein the layered structure maintains a post photoconversion efficiency of greater that or equal to about 90% following a heat treatment of 180° C. for 30 minutes and a heat treatment of 230° C. for 30 minutes, relative to an initial photoconversion efficiency prior to the two heat treatments.

2. The layered structure of claim 1, wherein the polymer matrix comprises a cross-linked polymer and a linear polymer comprising a carboxylic acid group-containing repeating unit.

3. The layered structure of claim 2, wherein the cross-linked polymer comprises a thiol-ene resin, a cross-linked poly(meth)acrylate, a cross-linked polyurethane, a cross-linked epoxy resin, a cross-linked vinyl polymer, a cross-linked silicone resin, or a combination thereof.

4. The layered structure of claim 3, wherein the carboxylic acid group-containing repeating unit is derived from a monomer comprising a carboxylic acid group and a carbon-carbon double bond, a monomer comprising a dianhydride moiety, or a combination thereof.

5. The layered structure of claim 1, wherein the quantum dot comprises a Group II-VI compound, a Group III-V compound, a Group IV-VI compound, a Group IV element or a compound, a Group I-III-VI compound, a Group I-II-IV-VI compound, or a combination thereof.

6. The layered structure of claim 1, wherein the repeating section further comprises a second section configured to emit a second light that is different from the first light; a third section configured to emit a third light that is different from the first light and the second light; or a combination thereof.

7. The layered structure of claim 1, wherein a maximum photoluminescent peak wavelength of the first light is in a range of greater than about 580 nanometers and less than or equal to about 680 nanometers, a maximum photoluminescent peak wavelength of the second light is in a range of greater than about 480 nanometers and less than or equal to about 580 nanometers, and a maximum photoluminescent peak wavelength of the third light is in a range of greater than about 380 nanometers and less than or equal to about 480 nanometers.

8. The layered structure of claim 1, wherein the organic layer is disposed directly on the surface of the repeating section of the quantum dot polymer composite pattern and the inorganic layer includes a yellow reflective filter comprising alternating layers of $SiO_2$ and $TiO_2$.

9. The layered structure of claim 1, wherein the inorganic material comprises a silicon oxide, a silicon nitride, a silicon oxynitride, a hafnium oxide, a tantalum oxide, a titanium oxide, a zirconium oxide, a zinc oxide, a zinc sulfide, a magnesium oxide, a cesium oxide, a lanthanum oxide, an indium oxide, a niobium oxide, an aluminum oxide, or a combination thereof.

10. The layered structure of claim 1, wherein the organic polymer of the organic layer comprises an aliphatic hydrocarbon backbone, an aliphatic hydrocarbon backbone comprising a carbonyl group, an ester group, an ether group, a thioether group, an arylene group, an alicyclic hydrocarbon group, or a combination thereof interposed therein, a siloxane backbone comprising an organic side chain attached to a silicon atom, or a combination thereof.

11. The layered structure of claim 1, wherein the organic polymer comprises a unit represented by Chemical Formula 1:

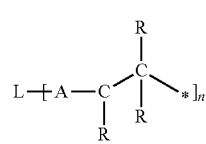

Chemical Formula 1 wherein L is a substituted or unsubstituted aliphatic hydrocarbon, a substituted or unsubstituted aliphatic hydrocarbon comprising a methylene group replaced with an ester group, an ether group, a carbonyl group, an amide group, or a combination thereof, a substituted or unsubstituted alkylene oxide moiety, a substituted or unsubstituted polyalkylene oxide moiety, a substituted or unsubstituted heterocyclic moiety, a substituted or unsubstituted alicyclic moiety, a substituted or unsubstituted aromatic hydrocarbon group, an organic siloxane moiety, or a combination thereof, R is the same or different and each is independently hydrogen or a C1 to C10 alkyl group, A is a single bond, a C1 to C10 alkylene group, an ether group, a carbonyl group, an ester group, —NH—, an amide group, or a combination thereof,

* is a portion that is linked to an adjacent unit in the polymer, and n is an integer of greater than or equal to 1 and less than or equal to 6.

12. The layered structure of claim 11, wherein the organic polymer comprises a unit represented by Chemical Formula 1-1, a unit represented by Chemical Formula 1-2, or a combination thereof:

Chemical Formula 1-1

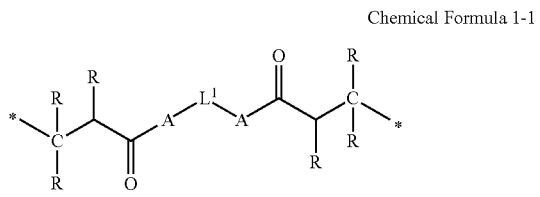

wherein $L^1$ is a C1 to C40 alkylene, a C1 to C40 alkenylene, —($R^1$O)n- (where R is a C1 to C10 alkylene, n is an integer from 1 to 20), —($R^2$O)n-($CR^3{}_2$)—($R^4$O)m- (where $R^2$ and $R^4$ are the same or different and each independently a C1 to C10 alkylene, $R^3$ are the same or different and each is independently hydrogen or a C1 to C10 alkyl group, and n is an integer from 1 to 20), or a combination thereof, R is the same or different and each is independently hydrogen or a C1 to C10 alkyl group, A is the same or different and each is independently a single bond, —O—, —NH—, or a combination thereof; and

* is a portion that is linked to an adjacent unit in the polymer,

Chemical Formula 1-2

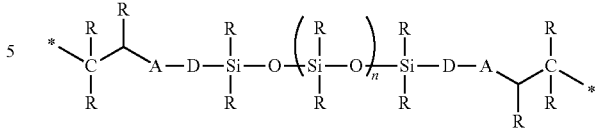

A is the same or different and each is independently a single bond, a C1 to C10 alkylene group, an ether group, a carbonyl group, an ester group, or a combination thereof, R is the same or different and each is independently hydrogen or a C1 to C10 alkyl group, D is the same or different and each is independently a single bond, a C1 to C10 alkylene group, a C1 to C10 alkylene group substituted with a hydroxyl group, or a C1 to C10 alkylene group or a C1 to C10 alkylene group substituted with a hydroxyl group wherein a methylene is replaced with an ether group; and

* is a portion that is linked to an adjacent unit in the polymer.

13. The layered structure of claim 1, wherein a cross-section of the layered structure does not show a defect of the inorganic layer at a position corresponding to a surface defect of the luminescent layer when the cross-section is observed with an electronic microscope.

14. The layered structure of claim 1, wherein the inorganic layer of the layered structure has a surface roughness of less than or equal to about 100 nanometers.

15. A display device comprising:
a lower substrate, an upper substrate, and a photoluminescent color filter layer provided on the upper substrate;
a polarizer disposed under the lower substrate; and
a backlight unit disposed under the polarizer,
wherein the photoluminescent color filter layer comprises the layered structure of claim 1.

16. The display device of claim 15, further comprising an optical element.

17. The display device of claim 16, wherein the optical element comprises at least one of a polarizer and a coating that controls a refractive index without a polarization function.

18. The display device of claim 15, wherein the repeating section further comprises a second section configured to emit light of a second peak wavelength that is different from the first peak wavelength, and the display further comprises a blue filter disposed on a region corresponding to at least one of the first section and the second section.

* * * * *